US011085760B2

(12) United States Patent
Takumi et al.

(10) Patent No.: US 11,085,760 B2
(45) Date of Patent: Aug. 10, 2021

(54) SHAPE MEASUREMENT SENSOR

(71) Applicant: HAMAMATSU PHOTONICS K.K., Hamamatsu (JP)

(72) Inventors: Munenori Takumi, Hamamatsu (JP); Haruyoshi Toyoda, Hamamatsu (JP); Yoshinori Matsui, Hamamatsu (JP); Kazutaka Suzuki, Hamamatsu (JP); Kazuhiro Nakamura, Hamamatsu (JP); Keisuke Uchida, Hamamatsu (JP)

(73) Assignee: HAMAMATSU PHOTONIC K.K., Hamamatsu (JP)

( * ) Notice: Subject to any disclaimer, the term of this patent is extended or adjusted under 35 U.S.C. 154(b) by 0 days.

(21) Appl. No.: 16/647,501

(22) PCT Filed: Sep. 19, 2018

(86) PCT No.: PCT/JP2018/034669
§ 371 (c)(1),
(2) Date: Mar. 14, 2020

(87) PCT Pub. No.: WO2019/059236
PCT Pub. Date: Mar. 28, 2019

(65) Prior Publication Data
US 2020/0217647 A1 Jul. 9, 2020

(30) Foreign Application Priority Data

Sep. 20, 2017 (JP) .............................. JP2017-180099

(51) Int. Cl.
*G01B 11/24* (2006.01)
*G01B 11/00* (2006.01)
(Continued)

(52) U.S. Cl.
CPC ............ *G01B 11/24* (2013.01); *G01B 11/002* (2013.01); *G01B 11/25* (2013.01); *G01J 1/02* (2013.01);
(Continued)

(58) Field of Classification Search
CPC ............ H04N 5/3696; H04N 5/36961; H04N 5/36965; G01J 1/02; G01J 1/0419;
(Continued)

(56) References Cited

U.S. PATENT DOCUMENTS 5,547,879 A    8/1996   Dierschke et al.
6,046,812 A *   4/2000   Baik ..................... G01B 11/25
                                                    250/559.23
(Continued)

FOREIGN PATENT DOCUMENTS

JP    S61-140827 A    6/1986
JP    S63-212832 A    9/1988
(Continued)

OTHER PUBLICATIONS

International Preliminary Report on Patentability dated Apr. 2, 2020 for PCT/JP2018/031806.
(Continued)

*Primary Examiner* — Gordon J Stock, Jr.
(74) *Attorney, Agent, or Firm* — Faegre Drinker Biddle & Reath LLP

(57) ABSTRACT

Provided is a shape measurement sensor including a light-receiving unit and a calculation unit. The light-receiving unit includes a plurality of pixel pairs. Each of the pixel pairs includes a first pixel and a second pixel that is disposed side by side with the first pixel along a first direction. In the first pixel, as an incident position is closer to one end of the light-receiving unit in a second direction, an intensity of a first electric signals decreases. In the second pixel, as the
(Continued)

incident position is closer to the one end, an intensity of a second electric signal increases. The calculation unit calculates the incident position in the second direction for each of the pixel pairs on the basis of the intensity of the first electric signal and the intensity of the acquired second electric signal.

6 Claims, 16 Drawing Sheets

(51) Int. Cl.
*H01L 27/144* (2006.01)
*H01L 31/02* (2006.01)
*H01L 31/0216* (2014.01)
*G01J 1/02* (2006.01)
*G01B 11/25* (2006.01)
*H01L 27/146* (2006.01)

(52) U.S. Cl.
CPC .... *H01L 27/1446* (2013.01); *H01L 27/14603* (2013.01); *H01L 27/14605* (2013.01); *H01L 27/14623* (2013.01); *H01L 31/02024* (2013.01); *H01L 31/02164* (2013.01); *H01L 31/02165* (2013.01)

(58) Field of Classification Search
CPC ...... G01J 1/0437; G01J 1/1626; G01J 1/4228; G01J 1/4257; G01J 1/44; G01J 2001/1663; G01J 2001/4261; G01J 2001/448; G01B 11/002; G01B 11/14; G01B 11/22; G01B 11/24; G01B 11/2408; G01B 11/2425; G01B 11/25; G01B 11/2518; G01B 11/2522; H01L 31/02162; H01L 31/02165; H01L 31/02024; H01L 27/1446; H01L 27/14603; H01L 27/14605; H01L 27/14607; H01L 27/1462; H01L 27/14621; H01L 27/14623

See application file for complete search history.

(56) References Cited

U.S. PATENT DOCUMENTS

| | | | | |
|---|---|---|---|---|
| 6,369,879 B1* | 4/2002 | Pedersen | ................ | G01B 11/24 |
| | | | | 356/3.01 |
| 7,176,431 B2* | 2/2007 | Sugiyama | .............. | H04N 5/335 |
| | | | | 250/208.1 |
| 7,684,052 B2* | 3/2010 | Suwa | ...................... | G06T 7/521 |
| | | | | 356/601 |
| 9,077,977 B2* | 7/2015 | Kawai | ................... | H04N 9/045 |
| 9,369,640 B2* | 6/2016 | Ikemoto | ................ | H04N 5/335 |
| 9,488,469 B1* | 11/2016 | Michael | ................ | G01B 11/25 |
| 10,277,830 B2* | 4/2019 | Sano | ...................... | H04N 5/378 |
| 10,325,953 B2* | 6/2019 | Kawahito | ......... | H01L 27/14638 |
| 10,341,595 B2* | 7/2019 | Jung | ................ | H01L 27/14623 |
| 10,819,932 B2* | 10/2020 | Takumi | ................ | G01J 1/0418 |
| 2020/0217644 A1* | 7/2020 | Takumi | ............ | H01L 27/14623 |
| 2020/0271512 A1* | 8/2020 | Takumi | ................ | G01J 1/4228 |

FOREIGN PATENT DOCUMENTS

| | | |
|---|---|---|
| JP | S63-229306 A | 9/1988 |
| JP | H03-34369 A | 2/1991 |
| JP | H04-313278 A | 11/1992 |

OTHER PUBLICATIONS

International Preliminary Report on Patantability dated Apr. 2, 2020 for PCT/JP2018/034669.

* cited by examiner

SHAPE MEASUREMENT SENSOR

TECHNICAL FIELD

The present disclosure relates a shape measurement sensor.

BACKGROUND ART

Patent Literature 1 discloses an optical sensor that detects an incident position of light. The optical sensor has a light-receiving region having a taper shape of which a width gradually widens along one direction in a plane. When light moves along the one direction on the light-receiving region having the shape, an output from the optical sensor linearly varies. A one-dimensional position in the one direction with respect to the incident position of the light is detected by using a variation of the output. When two optical sensors are disposed in opposite directions in a state in which hypotenuses thereof are in contact with each other, a variation rate of a differential output from the optical sensors is amplified two times in comparison to a variation rate of an output from individual optical sensors.

Patent Literature 2 discloses a two-dimensional light incident position detection element that detects a two-dimensional position to which light is incident.

CITATION LIST

Patent Literature

Patent Literature 1: Japanese Unexamined Patent Publication No. H3-34369
Patent Literature 2: Japanese Unexamined Patent Publication No. H4-313278

SUMMARY OF INVENTION

Technical Problem

Recently, a method in which a surface of an object is irradiated with line-shaped light (or the surface is scanned with spot-shaped light), and detects a position of reflected light from a direction inclined with respect to an irradiation direction to measure a surface shape of the object has been used. In the measurement method, it is required to detect the position of the reflected light at a high speed to shorten measurement time and to increase definition of a measurement result. For example, to detect the position of the reflected light, a two-dimensional image capturing element such as a CMOS image sensor can be used. However, in the image-capturing elements in which pixels are two-dimensionally arranged, electric signals are output from a plurality of pixels arranged over a plurality of rows and a plurality of columns, and thus time is taken in reading-out of the electric signals. Accordingly, there is a limit for detection of the position of the reflected light at a high speed.

An object of the present disclosure is to provide a shape measurement sensor capable of detecting a position of reflected light at a high speed.

Solution to Problem

According to an embodiment of the present disclosure, there is provided a shape measurement sensor that detects light that is emitted to irradiate a measurement line on a surface of an object and is reflected on the surface of the object to measure a surface shape of the object. The shape measurement sensor including: a light-receiving unit to which the light reflected on the measurement line is incident from a direction that is inclined with respect to an irradiation direction of the light; and a calculation unit that detects an incident position of the light in the light-receiving unit, and calculates position information of each position on the measurement line on the basis of the incident position. The light-receiving unit includes a plurality of pixel pairs, each of the pixel pairs including a first pixel that generates a first electric signal corresponding to an incident light amount of the light and a second pixel that is disposed side by side with the first pixel along a first direction intersecting the irradiation direction and generates a second electric signal corresponding to an incident light amount of the light, and the pixels pairs being arranged along the first direction. In the first pixel, as the incident position is closer to one end of the light-receiving unit in a second direction intersecting the first direction, the intensity of the first electric signals decreases. In the second pixel, as the incident position is closer to the one end in the second direction, the intensity of the second electric signal increases. The calculation unit acquires the first electric signal and the second electric signal for each of the pixel pairs, and calculates the incident position in the second direction for each of the pixel pairs on the basis of the intensity of the acquired first electric signal and the intensity of the acquired second electric signal.

In the shape measurement sensor, light is reflected on the measurement line of the surface of the object, and the reflected light is incident to the light-receiving unit. When the light is incident to the first pixel, the first electric signal corresponding to an incident light amount of the light is generated from the first pixel. Similarly, when the light is incident to the second pixel, the second electric signal corresponding to an incident light amount of the light is generated from the second pixel. The calculation unit detects the incident position of the light in the first direction for every pixel pair by acquiring the generated first electric signal and the generated second electric signal for every pixel pair. In addition, the calculation unit calculates the incident position in the second direction for every pixel pair by using a relationship between the incident position of the light in the second direction, the intensity of the first electric signal, and the intensity of the second electric signal. In this manner, two-dimensional position information of the incident position of the light in the light-receiving unit is detected for every pixel pair. In addition, two-dimensional position information of respective positions on the measurement line of the surface of the object is calculated on the basis of the two-dimensional position information of the incident position, and scanning of the measurement line is performed in a direction intersecting the measurement line, and thus a three-dimensional shape of the surface of the object is measured. In the shape measurement sensor, it is possible to detect two-dimensional information of the incident position in the second direction for every pixel pair in addition to the incident position in the first direction with only electric signals generated from respective pixel pairs. That is, it is possible to detect the two-dimensional information of the incident position of the light without separately generating an electric signal for detecting the incident position in the second direction. According to this, it is possible to suppress an increase of the number of electric signals, and thus it is possible to suppress an increase of time necessary for reading-out of the electric signals. Accordingly, according to the shape measurement sensor, it is possible to detect the incident position of light in the light-receiving unit at a high speed. As a result, it is possible to measure the three-dimensional shape of the surface of the object at a high speed, and it is possible to realize shortening of the measurement time and high definition of measurement results.

In the shape measurement sensor, the calculation unit may calculate the incident position in the second direction for each of the pixel pairs by using a ratio between the intensity of the first electric signal and the intensity of the second electric signal. In this case, it is possible to calculate the incident position of the light in the second direction with a simple calculation process, and thus it is possible to detect the incident position of the light at a high speed.

In the shape measurement sensor, the calculation unit may calculate the incident position in the second direction for each of the pixel pairs by using a ratio between the intensity of the first electric signal or the intensity of the second electric signal, and a total value of the intensity of the first electric signal and the intensity of the second electric signal. In this manner, when the intensity of the first electric signal or the intensity of the second electric signal is standardized by a total value of the intensity of the first electric signal and the intensity of the second electric signal, it is possible to compensate a fluctuation of the intensity of the electric signals. According to this, it is possible to detect the incident position of the light with accuracy.

In the shape measurement sensor, the light-receiving unit may further include a first transmission filter which covers the first pixel and through which the light is transmitted, and a second transmission filter which covers the second pixel and through which the light is transmitted, a transmittance of the light in the first transmission filter may decrease as it is closer to the one end in the second direction, and a transmittance of the light in the second transmission filter may increase as it is closer to the one end in the second direction. When the light-receiving unit includes the first transmission filter and the second transmission filter, in the first pixel, as the incident position of the light is closer to the one end in the second direction, an incident light amount of the light incident to the first pixel decreases, and according to this, the intensity of the first electric signal generated in the first pixel also decreases. In contrast, in the second pixel, as the incident position of the light is closer to the one end in the second direction, the incident light amount of the light incident to the second pixel increases, and according to this, the intensity of the second electric signal generated in the second pixel also increases. Accordingly, according to this configuration, it is possible to appropriately realize the light-receiving unit of the shape measurement sensor.

In the shape measurement sensor, the light-receiving unit may further include a first light-shielding part that covers another portion of the first pixel excluding one portion of the first pixel and shields the light, and a second light-shielding part that covers another portion of the second pixel excluding one portion of the second pixel and shields the light, a width of the one portion of the first pixel in the first direction may decrease as it is closer to the one end in the second direction, and a width of the one portion of the second pixel in the first direction may increase as it is closer to the one end in the second direction. When the light-receiving unit includes the first light-shielding part and the second light-shielding part, in the first pixel, as the incident position of the light is closer to the one end in the second direction, the incident light amount of the light incident to the first pixel decreases, and according to this, the intensity of the first electric signal generated in the first pixel also decreases. In contrast, in the second pixel, as the incident position of the light is closer to the one end in the second direction, the incident light amount of the light incident to the second pixel increase, and according to this, the intensity of the second electric signal generated in the second pixel also increases. Accordingly, according to this configuration, it is possible to appropriately realize the light-receiving unit of the shape measurement sensor.

In the shape measurement sensor, a width of the first pixel in the first direction may decrease as it is closer to the one end in the second direction, and a width of the second pixel in the first direction may increase as it is closer to the one end in the second direction. When the light-receiving unit includes the first pixel and the second pixel, in the first pixel, as the incident position of the light is closer to the one end in the second direction, the incident light amount of the light incident to the first pixel decreases, and according to this, the intensity of the first electric signal generated in the first pixel also decreases. In contrast, in the second pixel, as the incident position of the light is closer to the one end in the second direction, the incident light amount of the light incident to the second pixel increases, and according to this, the intensity of the second electric signal generated in the second pixel also increases. Accordingly, according to the configuration, it is possible to appropriately realize the light-receiving unit of the shape measurement sensor.

Advantageous Effects of Invention

According to the present disclosure, it is possible to detect a position of reflected light at a high speed.

DESCRIPTION OF EMBODIMENTS

Figure 1:
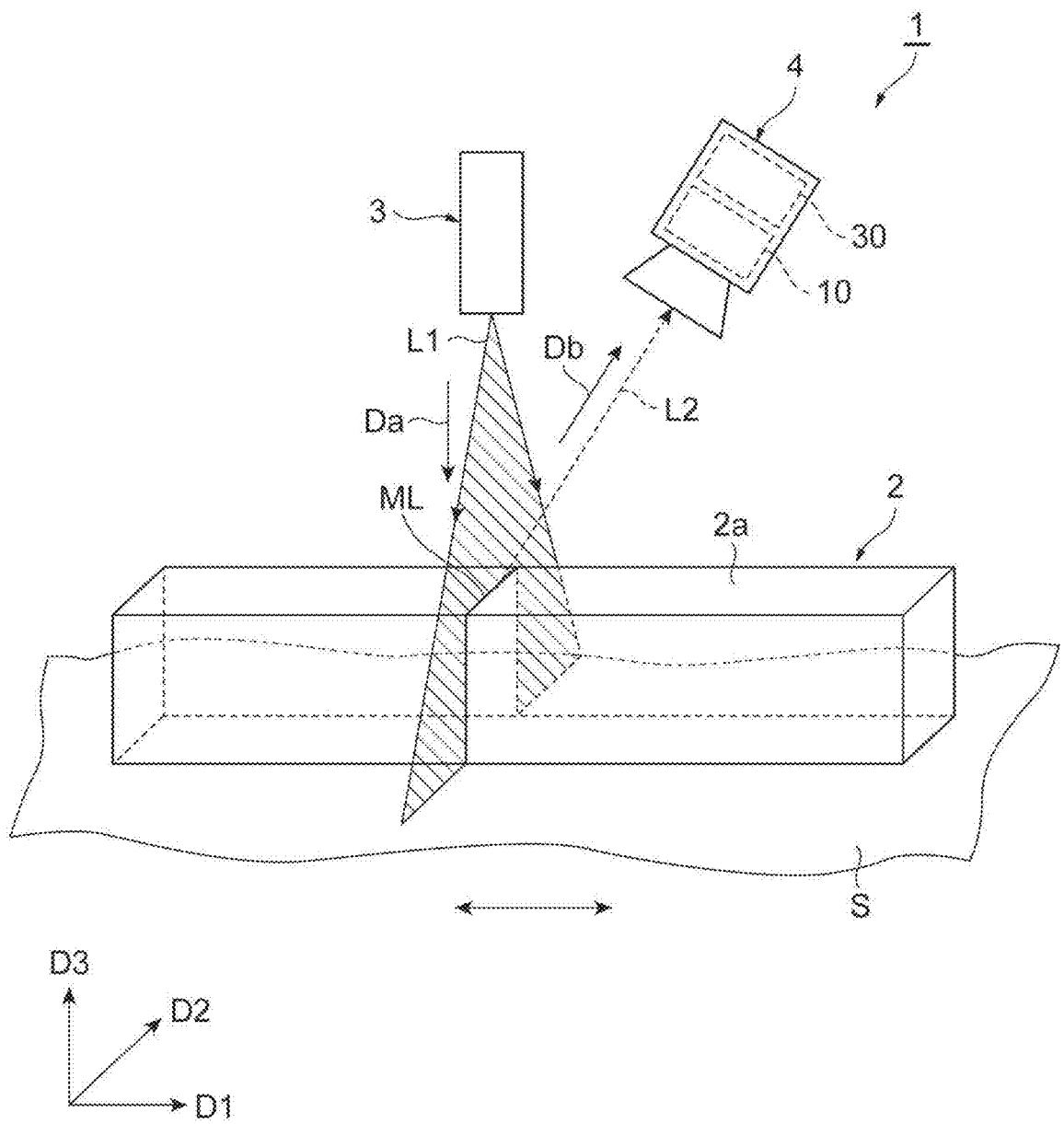
FIG. 1 is a schematic configuration diagram illustrating a shape measurement sensor according to an embodiment.

Hereinafter, an embodiment of a shape measurement sensor of the present disclosure will be described in detail with reference to the accompanying drawings. In description of the drawings, the same reference numeral will be given to the same element, and redundant description thereof will be appropriately omitted.

FIG. 1 is a schematic configuration diagram illustrating a shape measurement sensor 1 (shape measurement system) according to this embodiment. The shape measurement sensor 1 is a sensor that measures a surface shape of an object 2 by using a light sectioning method. Specifically, the shape measurement sensor 1 irradiates a surface 2a of the object 2 with line-shaped laser light L1 (or scans the surface 2a with spot-shaped laser light), and detects a position of reflected light L2 reflected on the surface 2a of the object 2 to measure a three-dimensional shape of the surface 2a of the object 2. Note that, the line shape represents that a shape of the laser light L1 in a plane intersecting an irradiation direction Da is a line shape. The object 2 is disposed on a disposition surface S of a movement stage that moves in a direction D1. A movement speed of the movement stage in the direction D1 is, for example, 1 m/s or less. The disposition surface S extends along the direction D1 and a direction D2 that intersects the direction D1 (that is orthogonal to the direction D1 in an example). The object 2 illustrated in FIG. 1 has a rectangular parallelepiped external shape in which the direction D1 is set as a longitudinal shape. The shape of the object 2 is not limited to the example, and all shapes can be employed.

As illustrated in FIG. 1, the shape measurement sensor 1 includes a light source 3 (irradiation unit) that irradiates the surface 2a of the object 2 with line-shaped laser light L1, and an image capturing device 4 that captures an image of reflected light L2 reflected on the surface 2a of the object 2. For example, the light source 3 emits the laser light L1 having a wavelength of a visible light band. The light source 3 is disposed at a position that faces the surface 2a of the object 2 in a direction D3 that intersects the direction D1 and the direction D2 (that is orthogonal to the directions in an example), and irradiates a line-shaped region extending on the surface 2a of the object 2 in the direction D2 with the laser light L1. Hereinafter, the line-shaped region will be referred to as "measurement line ML". Note that, the shape measurement sensor 1 may not include the light source 3.

The light source 3 includes a lens for forming the laser light L1 in a line shape in the measurement line ML. For example, the lens is a cylindrical lens, and condenses the laser light L1 in the direction D1 while spreading the laser light L1 in the direction D2. After the laser light L1 progresses along the direction D3 and passes through the lens, the laser light L1 is simultaneously emitted to respective positions on the measurement line ML of the surface 2a in a state of spreading in the direction D2. Here, the object 2 relatively moves with respect to the light source 3 and the image capturing device 4 along the direction D1 in accordance with movement of the movement stage in the direction D1. According to this, irradiation with the laser light L1 to the measurement line ML is sequentially performed with respect to the respective positions of the surface 2a along the direction D1.

For example, the image capturing device 4 is a vision camera including a vision chip that performs from acquisition of an image of the reflected light L2 from the measurement line ML to image processing. The image capturing device 4 sequentially captures images of the reflected light L2 reflected from the measurement line ML at a predetermined frame rate with respect to respective positions of the surface 2a along the direction D1, and performs processing of signals acquired from the image capturing. The image capturing device 4 includes a light-receiving unit 10 to which the reflected light L2 reflected on the measurement line ML is incident, and a signal processing unit 30 that processes signals output from the light-receiving unit 10 in correspondence with incident of the reflected light L2. The light-receiving unit 10 is provided in an inclination direction Db inclined from the measurement line ML with respect to an irradiation direction Da of the laser light L1 toward the measurement line ML. The inclination direction Db is inclined with respect to the irradiation direction Da in a direction excluding the direction D2 along the measurement line ML. In this embodiment, the inclination direction Db is inclined with respect to the irradiation direction Da in the direction D1 that intersects the measurement line ML. The reflected light L2 reflected on the measurement line ML is incident to the light-receiving unit 10 from the inclination direction Db.

Figure 2:
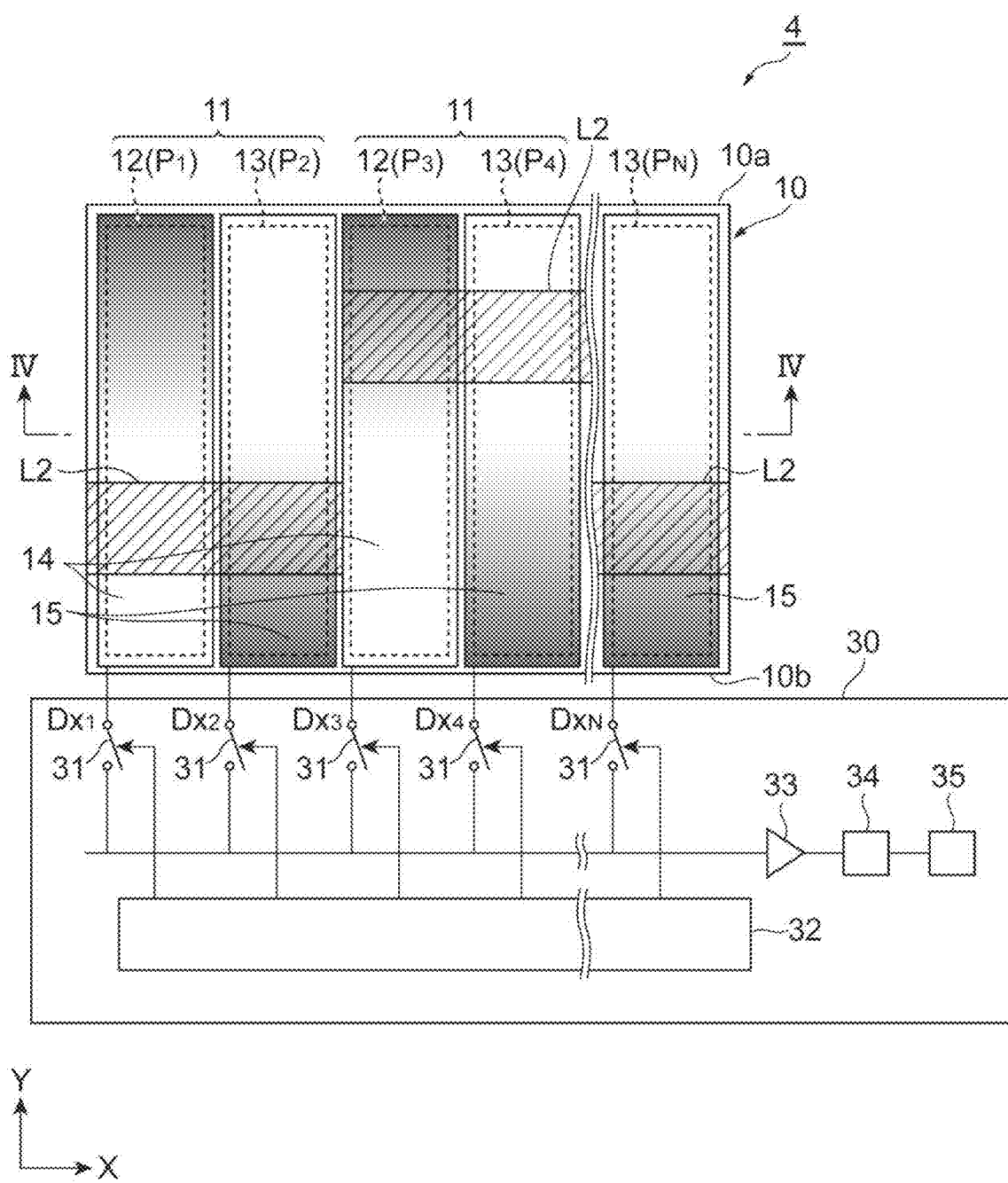
FIG. 2 is a schematic configuration diagram illustrating an image capturing device of the shape measurement sensor illustrated in FIG. 1.

Here, the configuration of the image capturing device 4 will be described in more detail with reference to FIG. 2 to FIG. 4. FIG. 2 is a schematic configuration diagram illustrating the image capturing device 4. In FIG. 2, an incident range of the reflected light L2 in the light-receiving unit 10 is illustrated with hatching. The light-receiving unit 10 includes a plurality of pixel pairs 11 arranged along an X-direction (first direction). The X-direction is a direction intersecting the irradiation direction Da, and conforms to the direction D2 in which the measurement line ML extends in an example (refer to FIG. 1). Each of the plurality of pixel pairs 11 includes a first pixel 12 and a second pixel 13 which are alternately disposed side by side along the X-direction. For example, each of the first pixel 12 and the second pixel 13 has a rectangular shape in which a Y-direction (second direction) intersecting the X-direction is set as a longitudinal direction. The Y-direction is a direction along the irradiation direction Da, and conforms to the direction D1 intersecting the measurement line ML in an example. Hereinafter, a plurality of the first pixels 12 and a plurality of the second pixels 13 are collectively referred to as a plurality of pixels $P_1$ to $P_N$ (N is an integer of two or greater, and represents the number of pixels). The pixels $P_1$, $P_3$, ..., and $P_{N-1}$ assigned with odd numbers correspond to the first pixels 12, and the pixel $P_2$, $P_4$, ..., and $P_N$ assigned with even numbers respectively correspond to the second pixels 13.

The pixels $P_1$ to $P_N$ respectively generate charge signals $Dx_1$ to $Dx_N$ corresponding to incident light amounts of the reflected light L2 that is incident. Specifically, when the reflected light L2 is incident to the first pixels 12, the first pixels $P_1$, $P_3$, ..., and $P_{N-1}$ generate charge signals $Dx_1$, $Dx_3$, ..., and $Dx_{N-1}$ (first electric signals) corresponding to incident light amounts of the reflected light L2. Similarly, when the reflected light L2 is incident to the second pixels $P_2, P_4, \ldots$, and $P_N$, the second pixels $P_2, P_4, \ldots$, and $P_N$ generate charge signals $Dx_2, Dx_4, \ldots$, and $Dx_N$ (second electric signals) corresponding to incident light amounts of the reflected light L2. The pixels $P_1$ to $P_N$ outputs the charge signals $Dx_1$ to $Dx_N$ to the other end 10b side in the Y-direction.

The light-receiving unit 10 further includes a plurality of first transmission filters 14 which are respectively disposed on the plurality of first pixels 12, and a plurality of second transmission filters 15 which are respectively disposed on the plurality of second pixels 13. FIG. 3 is a top view illustrating the transmission filters. FIG. 4 is a cross-sectional view taken along line IV-IV illustrated in FIG. 2. Each of the first transmission filters 14 is a filter through which the reflected light L2 incident to the first transmission filter 14 is transmitted, and covers the first pixel 12. Similarly, each of the second transmission filters 15 is a filter through which the reflected light L2 incident to the second transmission filter 15 is transmitted, and covers the second pixel 13. The first transmission filter 14 and the second transmission filter 15 have a rectangular shape in which the Y-direction is set as a longitudinal direction as in the first pixel 12 and the second pixel 13, and are alternately disposed side by side along the X-direction.

Figure 3:
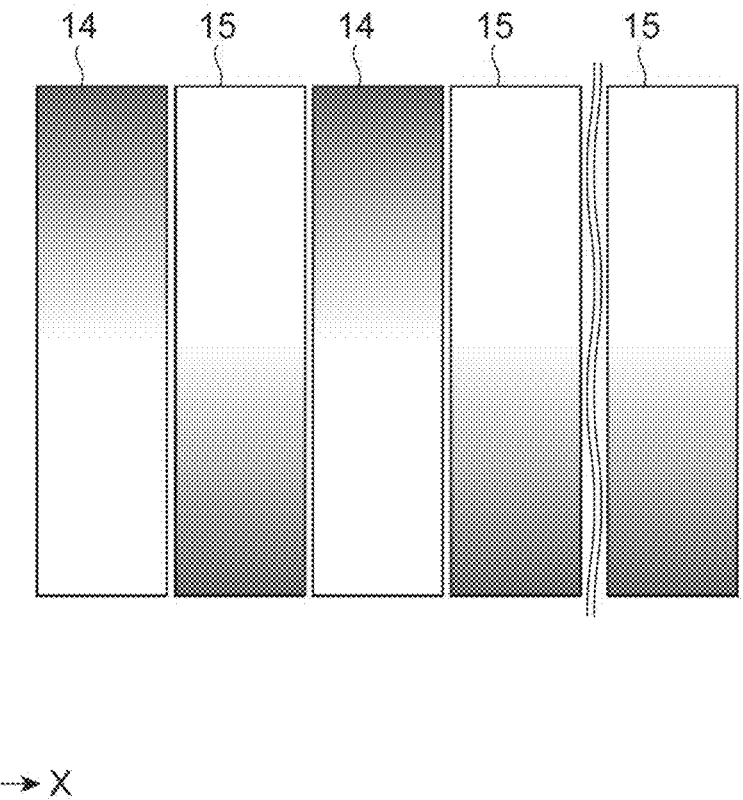
FIG. 3 is a top view illustrating a transmission filter of a light-receiving unit of the image capturing device illustrated in FIG. 2.
Figure 4:
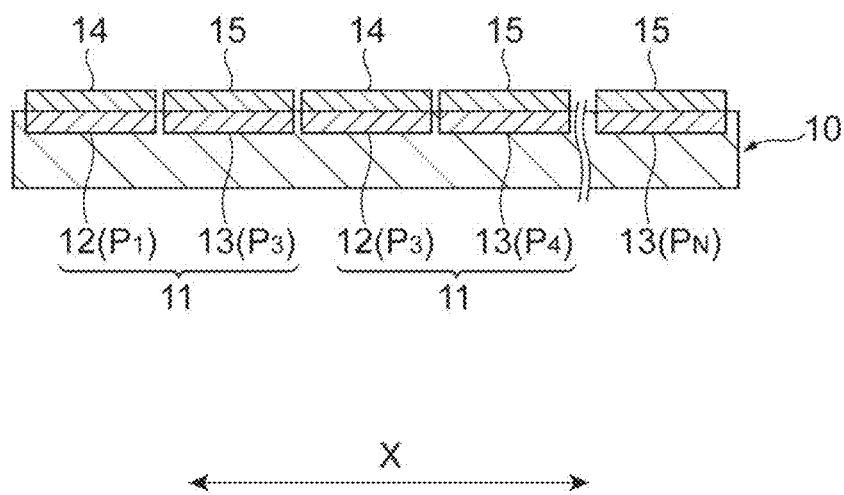
FIG. 4 is a cross-sectional view taken along line IV-IV illustrated in FIG. 1.

In FIG. 2 and FIG. 3, the transmittance of the first transmission filter 14 and the second transmission filter 15 is expressed in shades of color. The larger the transmittance of the transmission filters is, the shades are thinner, and the smaller the transmittance of the transmission filters is, the shades are darker. As illustrated in FIG. 2, the transmittance of the first transmission filter 14 gradually decreases (that is, decreases in a monotone manner) as it is closer to one end 10a of the light-receiving unit 10 in the Y-direction, and gradually increases (that is, increases in a monotone manner) as it is closer to the other end 10b of the light-receiving unit 10 on the first pixel 12. The transmittance of the first transmission filter 14 may decrease step by step as it is closer to the one end 10a, and may increases step by step as it is closer to the other end 10b on the first pixel 12.

As described above, an incident light amount of the reflected light L2 that is transmitted through the first transmission filter 14 having the above-described transmittance and is incident to the first pixel 12 gradually decreases (or decreases step by step) as an incident position of the reflected light L2 is closer to the one end 10a, and gradually increases (or increases step by step) as the incident position is closer to the other end 10b. According to this, intensities of the charge signals $Dx_1, Dx_3, \ldots$, and $Dx_{N-1}$ generated in the first pixels 12 also gradually decreases (or decreases step by step) as the incident position is closer to the one end 10a, and also gradually increases (or increases step by step) as the incident position is closer to the other end 10b.

In contrast, the transmittance of the second transmission filter 15 gradually increases (or increases step by step) as it is closer to the one end 10a, and gradually decreases (or decreases step by step) as it is closer to the other end 10b on the second pixel 13. An incident light amount of the reflected light L2 that is transmitted through the second transmission filter 15 having the above-described transmittance and is incident to the second pixel 13 gradually increases (or increases step by step) as an incident position of the reflected light L2 is closer to the one end 10a, and gradually decreases (or decreases step by step) as the incident position is closer to the other end 10b. According to this, intensities of the charge signals $Dx_2, Dx_4, \ldots$, and $Dx_N$ generated in the second pixels 13 also gradually increases (or increases step by step) as the incident position is closer to the one end 10a, and also gradually decreases (or decreases step by step) as the incident position is closer to the other end 10b. An increase direction or a decrease direction of the transmittance in the Y-direction is reversed between the first transmission filters 14 and the second transmission filters 15.

The signal processing unit 30 is provided on the other end 10b side (output side) in the Y-direction with respect to the pixels $P_1$ to $P_N$. The signal processing unit 30 reads out the charge signals $Dx_1$ to $Dx_N$ for each of the pixels $P_1$ to $P_N$, and detects the incident position of the reflected light L2 for each of the pixel pairs 11 in the light-receiving unit 10 on the basis of the charge signals $Dx_1$ to $Dx_N$ which are read out. A reading-out type of the charge signals $Dx_1$ to $Dx_N$ by the signal processing unit 30 is, for example, a rolling shutter type. That is, the signal processing unit 30 sequentially executes reading-out of the charge signals $Dx_1$ to $Dx_N$ from the pixels $P_1$ to $P_N$, and discarding (reset) of the charges accumulated in the pixels $P_1$ to $P_N$ in a pixel unit. The reading-out type of the charge signals $Dx_1$ to $Dx_N$ by the signal processing unit 30 may be a global shutter type. In this case, the signal processing unit 30 reads out the charge signals $Dx_1$ to $Dx_N$ for every frame rate, and executes reset of the charges of all of the pixels $P_1$ to $P_N$.

The signal processing unit 30 includes a plurality of switch elements 31, a shift register 32, an amplifier 33, an A/D converter 34, and a calculation unit 35. Input terminals of the switch elements 31 are electrically connected to the pixels $P_1$ to $P_N$, respectively. The shift register 32 is provided to sequentially read out the charge signals $Dx_1$ to $Dx_N$ from the pixels $P_1$ to $P_N$. The shift register 32 outputs a control signal for controlling an operation of the switch elements 31. The switch elements 31 are sequentially closed by the control signal that is output from the shift register 32. When the switch elements 31 are sequentially closed, the charge signals $Dx_1$ to $Dx_N$ generated in the pixels $P_1$ to $P_N$ are sequentially output from output terminals of the switch elements 31. The amplifier 33 is electrically connected to the output terminals of the switch elements 31, and outputs a voltage value corresponding to the charge signals $Dx_1$ to $Dx_N$ output from the output terminals of the switch elements 31. The A/D converter 34 is electrically connected to the amplifier 33, converts voltage values output from the amplifier 33 into digital values, and outputs the digital values. The digital values are values corresponding to intensities of the charge signals $Dx_1$ to $Dx_N$. Accordingly, hereinafter, description may be given in a state of substituting the digital values with the intensities of the charge signals $Dx_1$ to $Dx_N$.

The calculation unit 35 is electrically connected to the A/D converter 34, and acquires digital values output from the A/D converter 34, that is, digital values corresponding to the charge signals $Dx_1$ to $Dx_N$ for each of the pixel pair 11. According to this, the calculation unit 35 can acquire position coordinates of the pixel pairs 11 which output the charge signals $Dx_1$ to $Dx_N$ in the X-direction for each of the pixel pairs 11 as position information Lx indicating the incident position of the reflected light L2 in the X-direction. Here, when the first pixel 12 and the second pixel 13 of an $r^{th}$ pixel pair 11 are respectively set as $P_{2r-1}$ and $P_{2r}$ ($r=1, 2, \ldots R$, R represents the number of the pixel pairs 11), and the position information Lx in the $r^{th}$ pixel pair 11 is set as $Lx_r$, a position coordinate of the $r^{th}$ pixel pair 11 in the X-direction, that is, the position information $Lx_r$ is expressed, for example, by an average value $(x_{2r-1}+x_{2r})/2$ of the sum of a position coordinate $x_{2r-1}$ of the first pixel $P_{2r-1}$ in the X-direction and a position coordinate $x_{2r}$ of the second pixel $P_{2r}$ in the X-direction (refer to the following Expression (1)).

The calculation unit 35 calculates position information Ly that is an incident position of the reflected light L2 in the Y-direction for each of the pixel pairs 11 on the basis of the intensities of the charge signals $Dx_1$ to $Dx_N$ which are acquired for each of the pixel pairs 11. As described above, the intensities of the charge signals $Dx_1, Dx_3, \ldots$, and $Dx_{N-1}$ decrease as the incident position of the reflected light L2 is closer to the one end 10a of the light-receiving unit 10, and the intensities of the charge signals $Dx_2, Dx_4, \ldots$, and $Dx_N$ increase as the incident position of the reflected light L2 is closer to the one end 10a. The calculation unit 35 calculates the position information Ly for each of the pixel pairs 11 by using a variation of the intensities of the charge signals $Dx_1$ to $Dx_N$ with respect to the incident position of the reflected light L2, and by using a ratio between the intensities of the charge signals $Dx_1, Dx_3, \ldots$, and $Dx_{N-1}$ and the intensities of the charge signals $Dx_2, Dx_4, \ldots$, and $Dx_N$.

Here, when position information Ly in the $r^{th}$ pixel pair 11 is set as $Ly_r$, and charge signals output from the first pixel $P_{2r-1}$ and the second pixel $P_{2r}$ are set as $Dx_{2r-1}$ and $Dx_{2r}$, the position information $Ly_r$ is calculated by taking a ratio between the intensity of the charge signal $Dx_{2r-1}$ and the intensity of the charge signal $Dx_{2r}$. Accordingly, the position information $Lx_r$ and the position information $Ly_r$ are expressed by the following Expression (1).

[Mathematical Formula 1]

$$(Lx_r, Ly_r) = \left(\frac{x_1 + x_2}{2}, \frac{Dx_2}{Dx_1}\right), \quad (1)$$
$$\left(\frac{x_3 + x_4}{2}, \frac{Dx_4}{Dx_3}\right), \ldots \left(\frac{x_{2R-1} + x_{2R}}{2}, \frac{Dx_{2R}}{Dx_{2R-1}}\right)$$

The position information $Ly_r$ may be calculated by taking a ratio between the intensity of the charge signal $Dx_{2r}$ (or the intensity of the charge signal $Dx_{2r-1}$) and a total value of the intensity of the charge signal $Dx_{2r-1}$ and the charge signal $Dx_{2r}$. In this case, the position information $Lx_r$ and the position information $Ly_r$ are expressed by the following Expression (2).

[Mathematical Formula 2]

$$(Lx_r, Ly_r) = \left(\frac{x_1 + x_2}{2}, \frac{Dx_2}{Dx_1 + Dx_2}\right), \quad (2)$$
$$\left(\frac{x_3 + x_4}{2}, \frac{Dx_4}{Dx_3 + Dx_4}\right), \ldots \left(\frac{x_{2R-1} + x_{2R}}{2}, \frac{Dx_{2R}}{Dx_{2R-1} + Dx_{2R}}\right)$$

In Expression (1) or Expression (2), the position information $Lx_r$ may be expressed by the position coordinate $x_{2r-1}$ of the first pixel $P_{2r-1}$ in the X-direction. In this case, the position information $Lx_r$ and the position information $Ly_r$ are expressed by the following Expression (3) or Expression (4). In addition, the position information $Lx_r$ may be expressed by the position coordinate $x_{2r}$ of the second pixel $P_{2r}$ in the X-direction.

[Mathematical Formula 3]

$$(Lx_r, Ly_r) = \left(x_1, \frac{Dx_2}{Dx_1}\right), \left(x_3, \frac{Dx_4}{Dx_3}\right), \ldots \left(x_{2R-1}, \frac{Dx_{2R}}{Dx_{2R-1}}\right) \quad (3)$$

[Mathematical Formula 4]

$$(Lx_r, Ly_r) = \left(x_1, \frac{Dx_2}{Dx_1 + Dx_2}\right), \quad (4)$$
$$\left(x_3, \frac{Dx_4}{Dx_3 + Dx_4}\right), \ldots \left(x_{2R-1}, \frac{Dx_{2R}}{Dx_{2R-1} + Dx_{2R}}\right)$$

The calculation unit 35 calculates two-dimensional position information of respective positions on the measurement line ML of the surface 2a of the object 2 on the basis of the position information $Lx_r$ and the position information $Ly_r$ which are obtained as described above. Specifically, the calculation unit 35 calculates the two-dimensional position information of each position on the measurement line ML by associating the position information $Lx_r$ of each of the pixel pairs 11 with each position on the measurement line ML in the direction D2, and by associating the position information $Ly_r$ of the pixel pair 11 with a height of the position on the measurement line ML from the disposition surface S. In addition, the calculation unit 35 calculates two-dimensional information of the measurement line ML at each position of the surface 2a along the direction D1 in correspondence with movement of the object 2 in the direction D1. According to this, it is possible to measure a three-dimensional shape of the surface 2a of the object 2.

Description will be given of an effect obtained by the shape measurement sensor 1 of this embodiment described above. In the shape measurement sensor 1, the laser light L1 from the light source 3 is reflected on the measurement line ML of the surface 2a of the object 2, and the reflected light L2 that is reflected is incident to the light-receiving unit 10. When the reflected light L2 is incident to the first pixel $P_{2r-1}$, the charge signal $Dx_{2r-1}$ corresponding to an incident light amount of the reflected light L2 is generated from the first pixel $P_{2r-1}$. Similarly, when the reflected light L2 is incident to the second pixel $P_{2r}$, the charge signal $Dx_{2r}$ corresponding to the incident light amount of the reflected light L2 is generated from the second pixel $P_{2r}$. The calculation unit 35 acquires the generated charge signal $Dx_{2r-1}$ and charge signal $Dx_{2r}$ for each of the pixel pairs 11 to detect the position information $Lx_r$ indicating the incident position of the reflected light L2 in the X-direction for each of the pixel pairs 11. In addition, the calculation unit 35 calculates the position information $Ly_r$ indicating the incident position in the Y-direction for each of the pixel pairs 11 by using a relationship between the incident position of the reflected light L2 in the Y-direction, and the intensities of the charge signal $Dx_{2r-1}$ and the charge signal $Dx_{2r}$. In this manner, the position information $Lx_r$ and the position information $Ly_r$ which indicate the incident positions of the reflected light L2 in the light-receiving unit 10 is detected for each of the pixel pair 11. In addition, the two-dimensional position information of each position on the measurement line ML is calculated on the basis of the position information $Lx_r$ and the position information $Ly_r$, and the object 2 is moved in the direction D1, the three-dimensional shape of the surface 2a of the object 2 is measured. In the shape measurement sensor 1 according to this embodiment, it is possible to detect the position information $Ly_r$ indicating the incident position in the Y-direction in addition to the position information $Lx_r$ indicating the incident position in the X-direction for each of the pixel pairs 11 with only the charge signal $Dx_{2r-1}$ and the charge signal $Dx_{2r}$ which are generated from each of the pixel pairs 11. That is, it is possible to detect the two-dimensional information of the incident position of the reflected light L2 without separately generating a charge signal for detecting position information indicating the incident position in the Y-direction. According to this, it is possible to suppress an increase of the number of the charge signals, and it is possible to suppress an increase of time necessary for reading-out of the charge signals. Accordingly, according to the shape measurement sensor 1, it is possible to detect the incident position of the reflected light L2 in the light-receiving unit 10 at a high speed. As a result, it is possible to measure the three-dimensional shape of the surface 2a of the object 2 at a high speed, and it is possible to realize reduction of the measurement time and high definition of the measurement results.

In the shape measurement sensor 1, the calculation unit 35 calculates the position information $Ly_r$ indicating the incident position in the Y-direction for each of the pixel pairs 11 by using a ratio between the intensity of the charge signal $Dx_{2r-1}$ and the intensity of the charge signal $Dx_{2r}$. In this case, it is possible to calculate the position information $Ly_r$ with a simple calculation process, and thus it is possible to detect position information $Lx_r$ and the position information $Ly_r$ which indicate the incident position of the reflected light L2 at a high speed.

In the shape measurement sensor 1, the calculation unit 35 may calculate the position information $Ly_r$ for each of the pixel pairs 11 by using a ratio between the intensity of the charge signal $Dx_{2r-1}$ or $Dx_{2r}$ and a total value of the charge signal $Dx_{2r-1}$ or $Dx_{2r}$. In this manner, when the intensity of the charge signal $Dx_{2r-1}$ or $Dx_{2r}$ is standardized by a total value of the intensity of the charge signal $Dx_{2r-1}$ or $Dx_{2r}$, it is possible to compensate a fluctuation of the intensities of the charge signals $Dx_{2r-1}$ and $Dx_{2r}$. According to this, it is possible to detect the position information Lx and the position information $Ly_r$ with accuracy.

In the shape measurement sensor 1, the light source 3 irradiates respective positions on the measurement line ML with the line-shaped laser light L1. In this case, as described above, the calculation unit 35 can appropriately calculate the two-dimensional position information of the respective positions on the measurement line ML by associating the respective positions on the measurement line ML with position coordinates of the pixel pairs 11 in the X-direction.

First Modification Example

Figure 5:
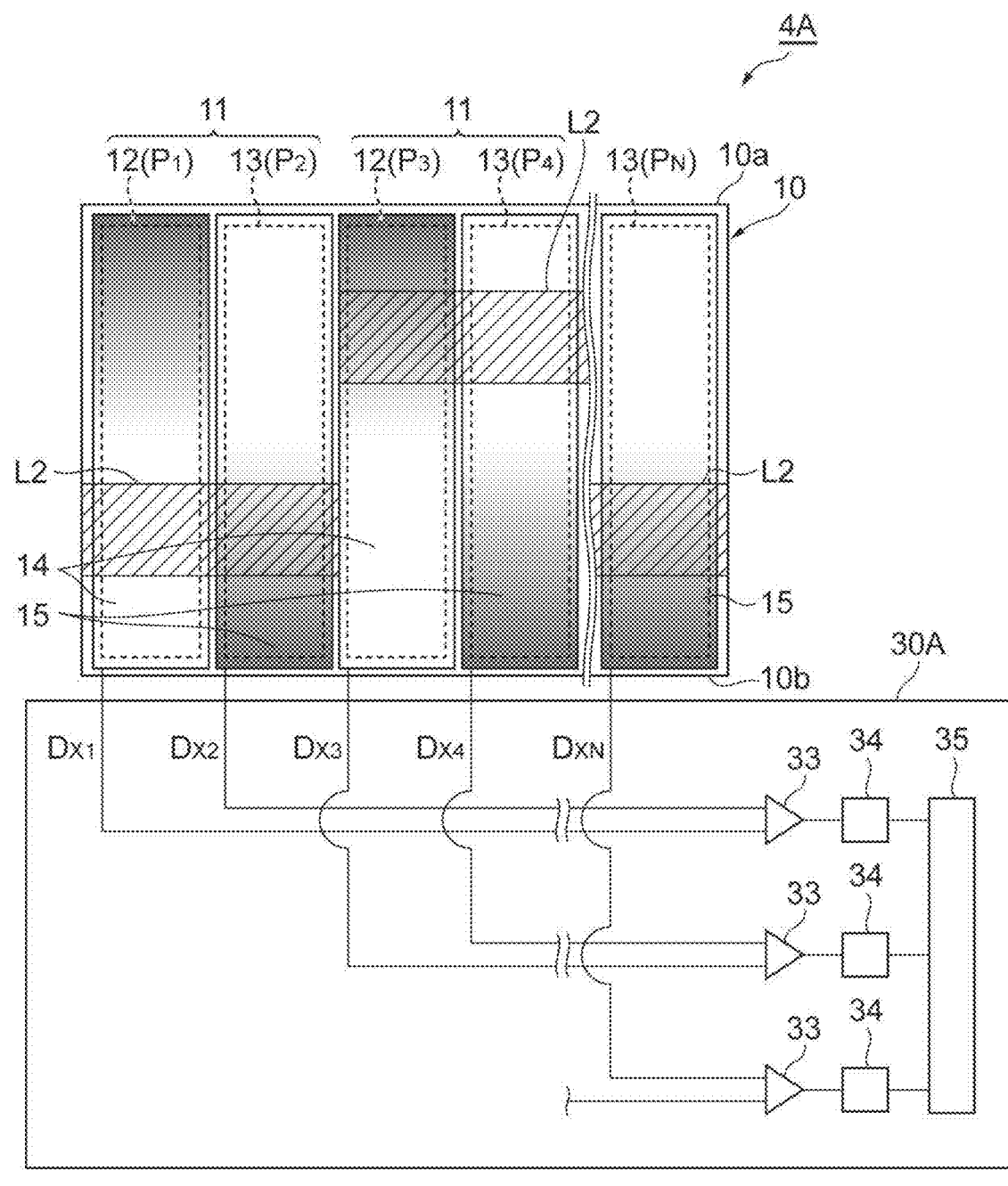
FIG. 5 is a schematic configuration diagram illustrating an image capturing device according to a first modification example.

FIG. 5 is a schematic configuration diagram illustrating an image capturing device 4A according to a first modification example. A difference between this modification example and the embodiment is a configuration of the signal processing unit of the image capturing device. In a signal processing unit 30A of this modification example, the shift register 32 for sequentially reading out the charge signals $Dx_1$ to $Dx_N$ from the pixels $P_1$ to $P_N$ is not provided, and the amplifier 33 is provided for each of the pixel pairs 11. The amplifier 33 includes two input terminals which are electrically connected to the first pixel 12 and the second pixel 13 of each of the pixel pairs 11, respectively. The charge signal $Dx_1$, $Dx_3$, ..., or $Dx_{N-1}$ (that is, charge signal $Dx_{2r-1}$) generated in the first pixel 12 and the charge signal $Dx_2$, $Dx_4$, ..., or $Dx_N$ (that is, charge signal $Dx_{2r}$) generated in the second pixel 13 are respectively input to the input terminals of the amplifier 33. The amplifier 33 outputs a value indicating a ratio between the charge signal $Dx_{2r}$, and the charge signal $Dx_{2r}$ in each of the pixel pairs 11 to the calculation unit 35. The calculation unit 35 acquires the values for each of the pixel pairs 11, and thus position coordinates, which correspond to the values, of the pixel pairs 11 in the X-direction can be acquired for each of the pixel pairs 11 as the position information $Lx_r$, and the values can be obtained for each of the pixel pairs 11 as the position information $Ly_r$. In this manner, the calculation unit 35 detects the position information $Lx_r$ and the position information $Ly_r$ which are expressed by Expression (1) or Expression (3).

In this modification example, the calculation unit 35 can also detect the position information $Lx_r$ and the position information $Ly_r$ which are expressed by Expression (2) or Expression (4). In this case, an adder is provided on a connection line between one input terminal of each of the amplifiers 33 and each of the pixel pairs 11. The adder includes two input terminals which are electrically connected to the first pixel 12 and the second pixel 13, respectively, and an output terminal that is electrically connected to the one input terminal of the amplifier 33. The adder calculates a total value of the charge signal $Dx_{2r}$, and the charge signal $Dx_{2r}$, which are generated from the first pixel 12 and the second pixel 13, and outputs the calculated total value to the one input terminal of the amplifier 33. The amplifier 33 outputs a ratio between the charge signal $Dx_{2r-1}$ (or charge signal $Dx_{2r}$) input from the other input terminal of the amplifier 33 and the total value output from the adder to the calculation unit 35. According to this configuration, the calculation unit 35 can detect the position information $Lx_r$ and the position information $Ly_r$ with Expression (2) or Expression (4). According to the image capturing device 4A according to this modification example, the position information $Lx_r$ and the position information $Ly_r$ can be acquired as in the embodiment, and thus it is possible to obtain the same effect as in the embodiment. In addition, according to the image capturing device 4A according to this modification example, it is not necessary to sequentially perform reading-out of the charge signals $Dx_1$ to $Dx_N$ from the pixels $P_1$ to $P_N$ differently from the embodiment, and thus it is possible to simultaneously acquire position information of respective positions on the measurement line ML of the surface 2a of the object 2. According to this, it is possible to measure the surface shape of the object 2 in real time.

Second Modification Example

Figure 6:
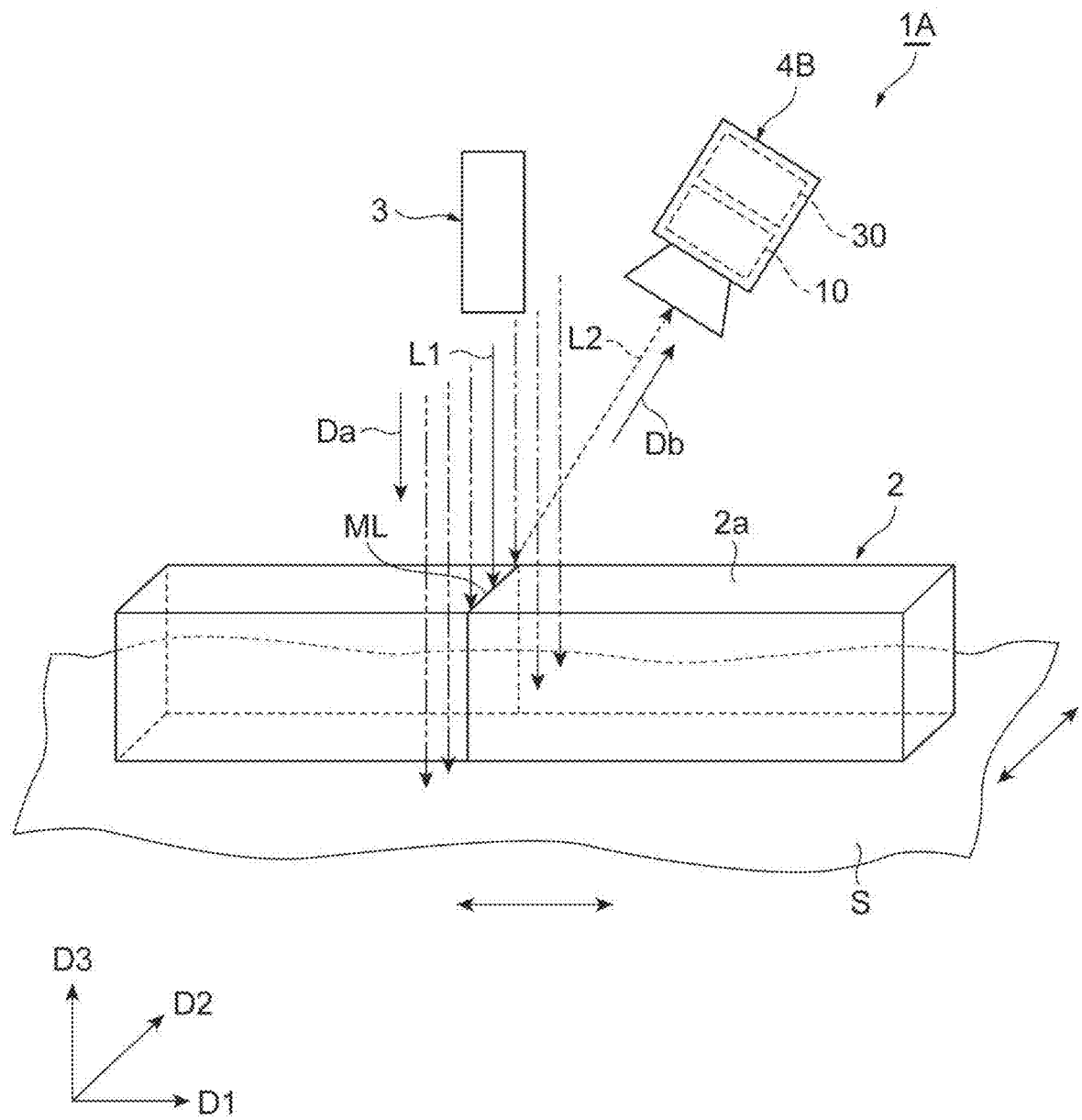
FIG. 6 is a schematic configuration diagram illustrating a shape measurement sensor including an image capturing device according to a second modification example.

FIG. 6 is a schematic configuration diagram illustrating a shape measurement sensor 1A including an image capturing device 4B according to a second modification example. In the shape measurement sensor 1A, the light source 3 irradiates respective positions on the measurement line ML of the surface 2a of the object 2 with spot-shaped laser light L1, and the movement stage on which the object 2 is disposed moves along the direction D2 along the measurement line ML of the surface 2a. Accordingly, the object 2 relatively moves with respect to the light source 3 and the image capturing device 4B along the direction D2. The light source 3 sequentially irradiates the respective positions on the measurement line ML with the laser light L1 in correspondence with the movement of the object 2 in the direction D2. After performing the irradiation with respect to all of the positions on the measurement line ML with the laser light L1, the movement stage moves along the direction D1, and irradiation of the measurement line ML with the laser light L1 at subsequent positions of the surface 2a along the direction D1 is performed, and the above-described process is repeated. The image capturing device 4B sequentially captures images of the reflected light L2 that is reflected respective positions on the measurement line ML of the surface 2a. In the shape measurement sensor 1A, it is preferable that a diameter of the laser light L1 emitted from the light source 3 is set so that a diameter of the reflected light L2 incident to the light-receiving unit 10 becomes smaller than a width of each of the pixel pair 11 in the X-direction, but there is no limitation thereto.

Figure 7:
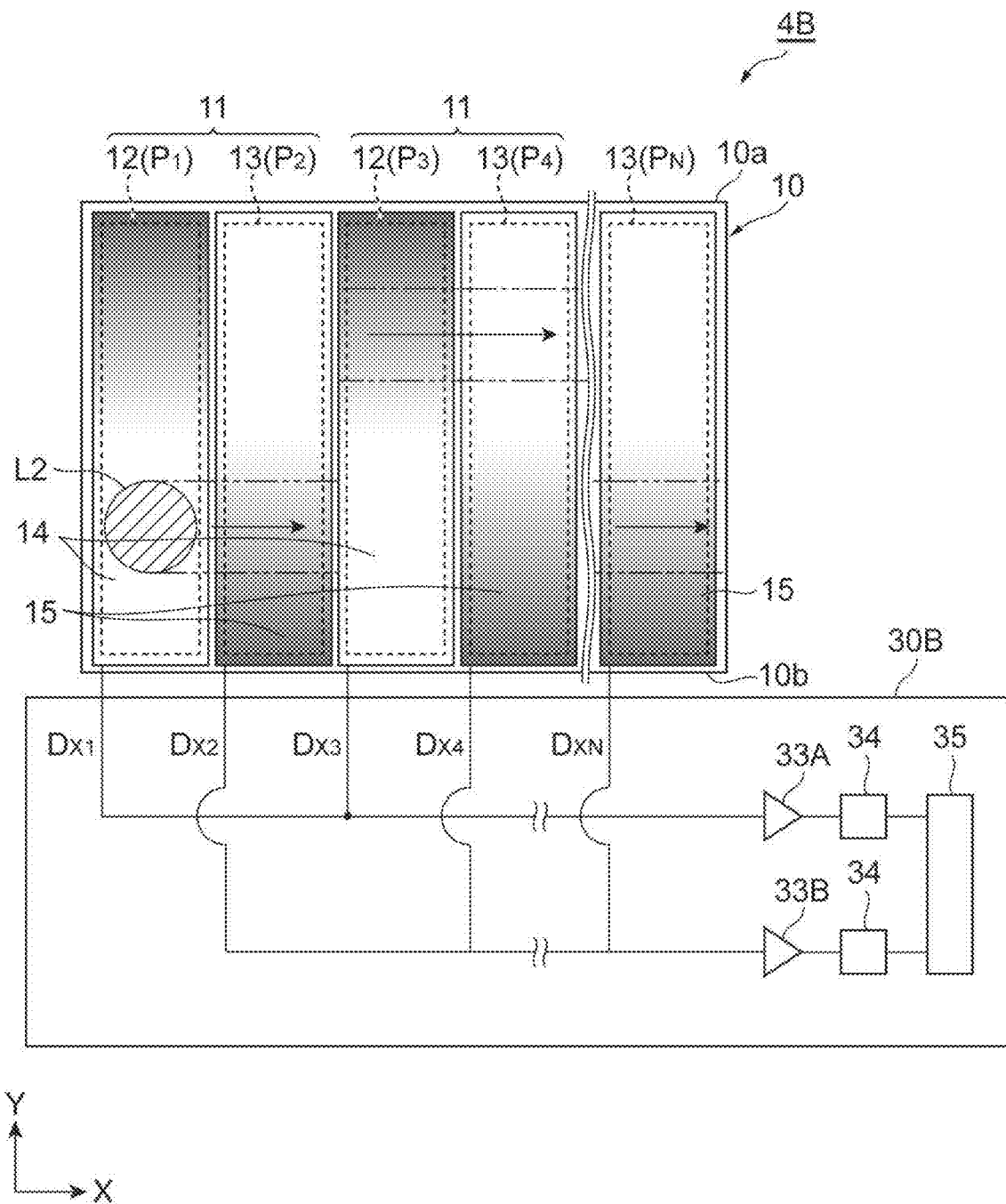
FIG. 7 is a schematic configuration diagram illustrating the image capturing device illustrated in FIG. 6.

FIG. 7 is a schematic configuration diagram illustrating the image capturing device 4B according to this modification example. In a signal processing unit 30B of this modification example, the shift register 32 for sequentially reading out the charge signals $Dx_1$ to $Dx_N$ from the pixels $P_1$ to $P_N$ is not provided, and an amplifier 33A that is electrically connected to each of the first pixels 12 and an amplifier 33B that is electrically connected to each of the second pixels 13 are provided. In a light-receiving unit 10, the reflected light L2 reflected at the respective positions on the measurement line ML is sequentially incident to each of the pixel pairs 11. According to this, charge signals $Dx_1$, $Dx_3$, ..., and $Dx_{2r-1}$ generated in the first pixels 12 of the pixel pairs 11 are sequentially input to the amplifier 33A, and charge signals $Dx_2$, $Dx_4$, ..., and $Dx_{2r}$ generated in the second pixels 13 are sequentially input to the amplifier 33B. The amplifier 33A sequentially inputs voltage values corresponding to intensities of the charge signals $Dx_1$, $Dx_3$, ..., and $Dx_{2r-1}$ to the calculation unit 35 through the A/D converter 34. The amplifier 33B sequentially inputs voltage values corresponding to intensities of the charge signals $Dx_2$, $Dx_4$, ..., and $Dx_{2r}$ to the calculation unit 35 through the A/D converter 34.

The calculation unit 35 acquires the charge signal $Dx_{2r-1}$ and the charge signal $Dx_{2r}$ for each of the pixel pairs 11 by associating the charge signal $Dx_{2r-1}$ and the charge signal $Dx_{2r}$ which are output from the amplifiers 33A and 33B with time at which the reflected light L2 is incident to each of the pixel pairs 11. Specifically, when time in incidence to an $r^{th}$ pixel pair 11 is set as $t_r$, the calculation unit 35 acquires time information $t_r$ for each of the pixel pairs 11 as the position information $Lx_r$ by associating a position coordinate of the pixel pair 11, from which the charge signal $Dx_{2r-1}$ and the charge signal $Dx_{2r}$ are output, in the X-direction with the time information $t_r$. In addition, as in the embodiment, the calculation unit 35 calculates the position information $Ly_r$ for each of the pixel pairs 11 on the basis of intensities of the charge signals $Dx_{2r-1}$ and $Dx_{2r}$ acquired for each of the pixel pairs 11. Accordingly, in this modification example, the position information $Lx_r$ and the position information $Ly_r$ are expressed by the following Expression (5) or Expression (6).

[Mathematical Formula 5]

$$(Lx_r, Ly_r) = \left(t_1, \frac{Dx_2}{Dx_1}\right), \left(t_2, \frac{Dx_4}{Dx_3}\right), \ldots \left(t_R, \frac{Dx_{2R}}{Dx_{2R-1}}\right) \quad (5)$$

[Mathematical Formula 6]

$$(Lx_r, Ly_r) = \left(t_1, \frac{Dx_2}{Dx_1 + Dx_2}\right), \quad (6)$$
$$\left(t_2, \frac{Dx_4}{Dx_3 + Dx_4}\right), \ldots \left(t_R, \frac{Dx_{2R}}{Dx_{2R-1} + Dx_{2R}}\right)$$

Third Modification Example

Figure 8:
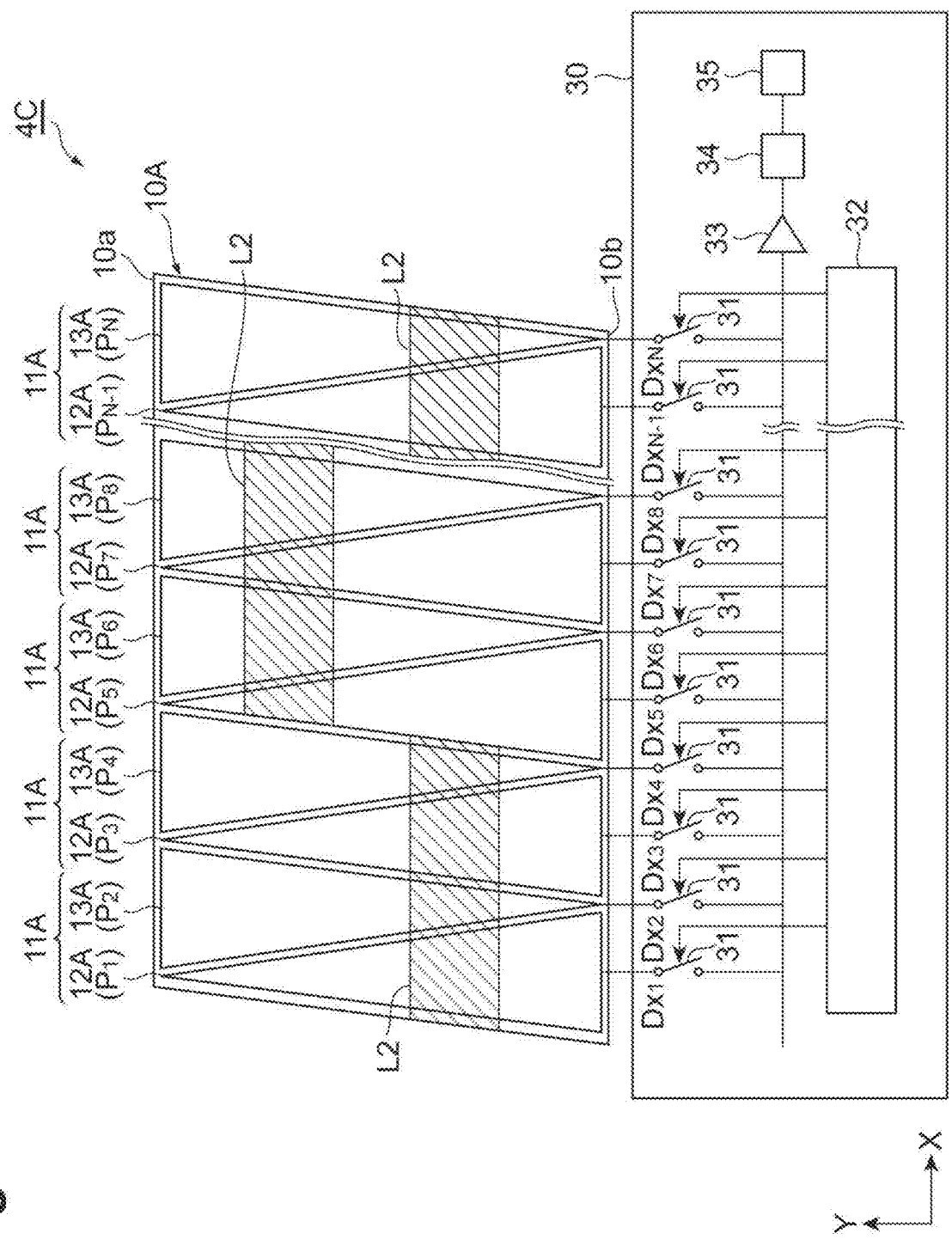
FIG. 8 is a schematic configuration diagram illustrating an image capturing device according to a third modification example.

FIG. 8 is a schematic configuration diagram illustrating an image capturing device 4C according to a third modification example. A difference between this modification example and the embodiment is in that shapes of the pixels $P_1$ to $P_N$ are different, and the first transmission filter 14 and the second transmission filter 15 are not provided. In a light-receiving unit 10A of this modification example, a width of a first pixel 12A in the X-direction gradually decreases as it is closer to one end 10a, and gradually increase as it is closer to the other end 10b. In an example, the first pixel 12A has an isosceles triangular shape that tapers toward the one end 10a side in the Y-direction. In contrast, a width of a second pixel 13A in the X-direction gradually increases as it is closer to the one end 10a, and gradually decreases as it is closer to the other end 10b. In an example, the second pixel 13A has an isosceles triangular shape that tapers toward the other end 10b side in the Y-direction.

When the light-receiving unit 10A includes the pixels $P_1$ to $P_N$ having the above-described shape, as the incident position of the reflected light L2 in the first pixel 12A is closer to the one end 10a, an incident light amount of the reflected light L2 incident to the first pixels 12A decreases, and according to this, intensities of charge signals $Dx_1$, $Dx_3$, ..., and $Dx_{N-1}$ generated in the first pixels 12A also decrease. In contrast, the incident position of the reflected light L2 in the second pixel 13A is closer to the one end 10a, an incident light amount of the reflected light L2 incident to the second pixels 13A increases, and according to this, intensities of charge signals $Dx_2$, $Dx_4$, ..., and $Dx_N$ generated in the second pixels 13A also increase. Even in a case where the pixels $P_1$ to $P_N$ have the above-described shape, it is possible to detect the position information $Lx_r$ and the position information $Ly_r$ as in the embodiment, and thus it is possible to obtain the same effect as in the embodiment.

Figure 9:
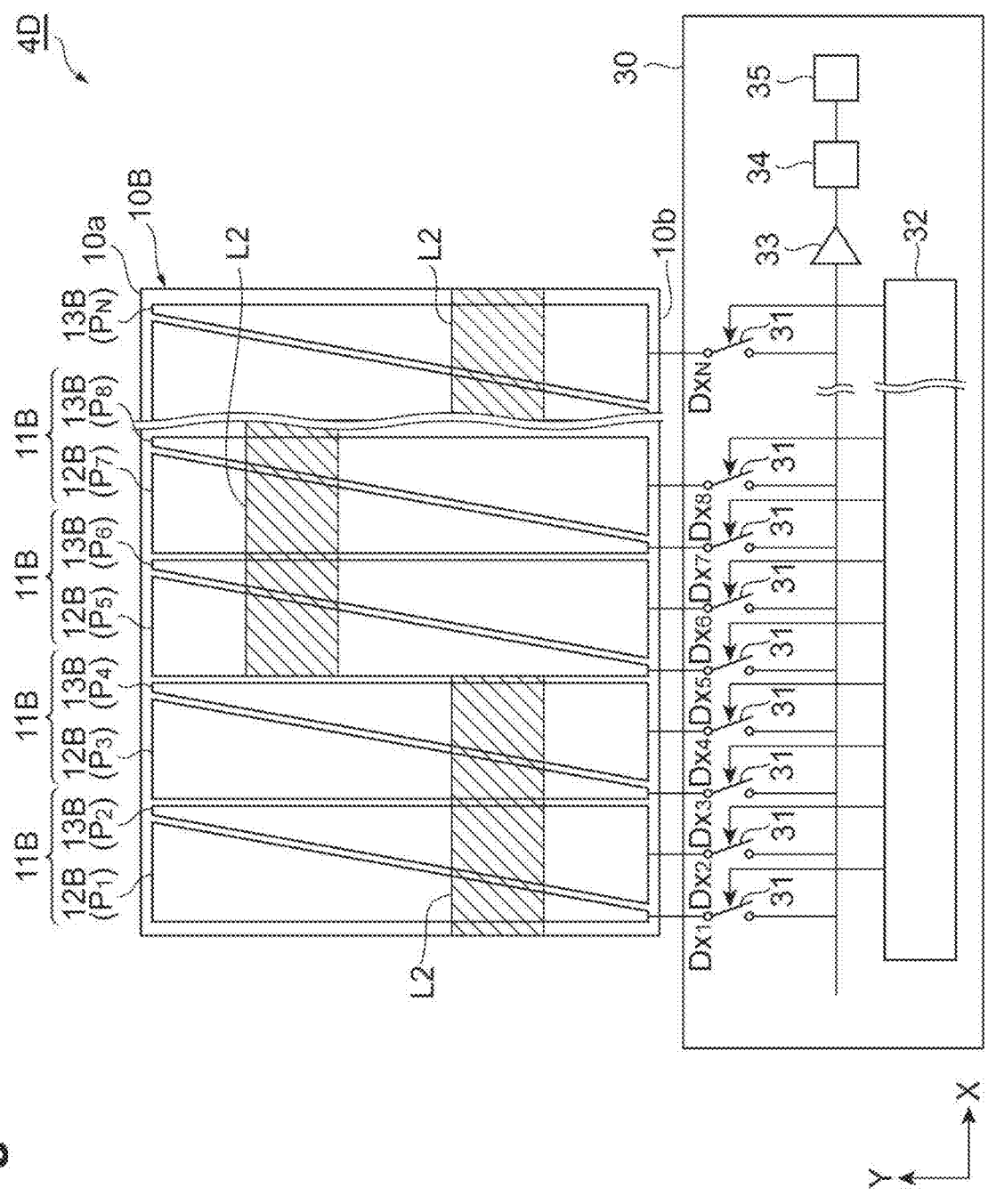
FIG. 9 is a schematic configuration diagram illustrating another example of a light-receiving unit of the image capturing device illustrated in FIG. 8.

The shape and the arrangement of the pixels $P_1$ to $P_N$ are not limited to the above-described shape. FIG. 9 to FIG. 13 illustrate other examples of the pixels $P_1$ to $P_N$ according to this modification example. FIG. 9 is a schematic configuration diagram illustrating another example of the shape of the pixels $P_1$ to $P_N$ according to this modification example. In the example illustrated in FIG. 9, a first pixel 12B has a right-angled triangular shape that tapers toward the one end 10a side of the light-receiving unit 10B in the Y-direction. On the other hand, a second pixel 13B has a right-angled triangular shape that tapers toward the other end 10b side of the light-receiving unit 10B in the Y-direction. Outer edges of the first pixels 12B and the second pixel 13B which are located at a boundary of pixel pairs 11B are not inclined with respect to the Y-direction, and extend along the Y-direction.

Figure 10:
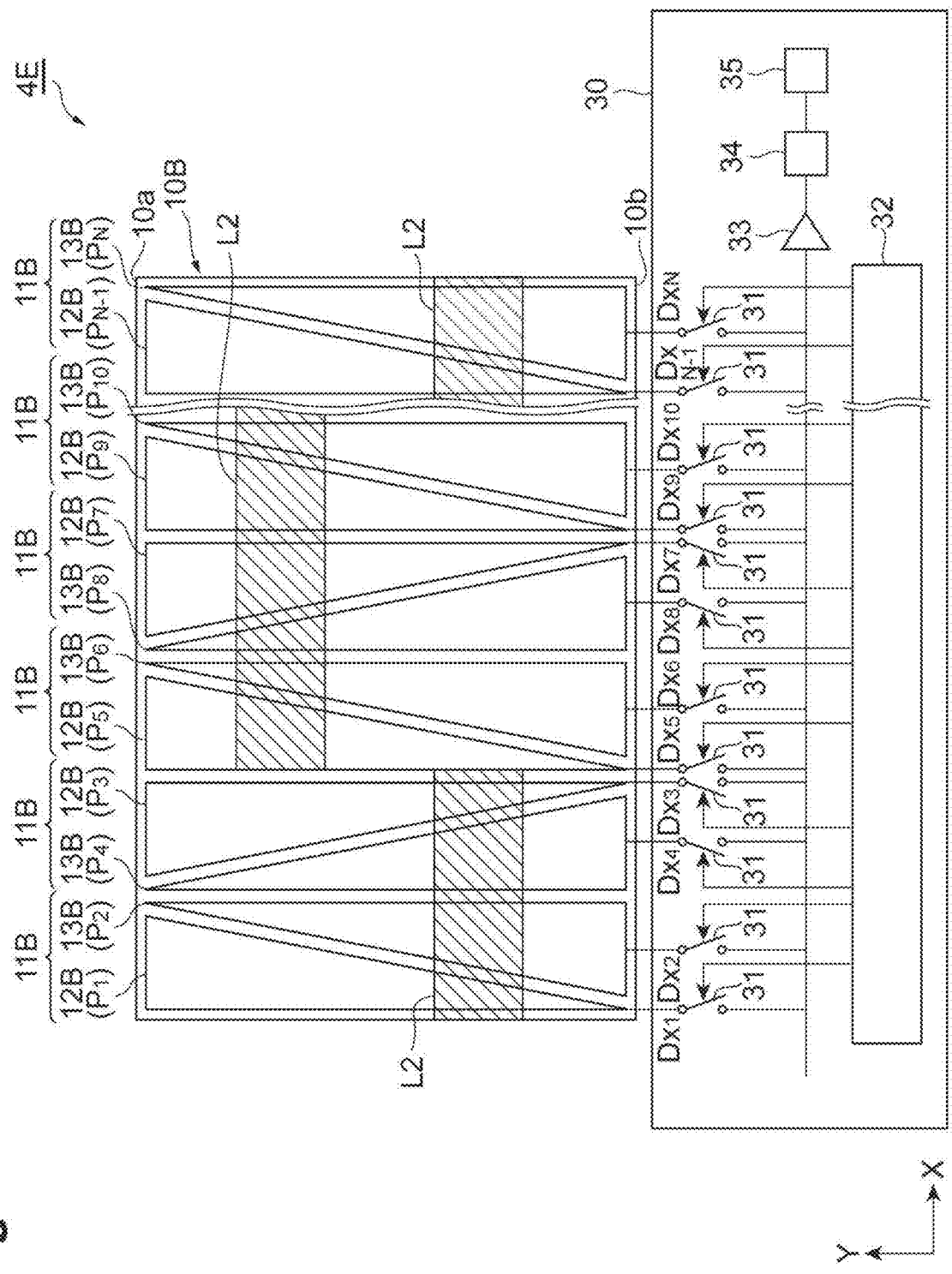
FIG. 10 is a schematic configuration diagram illustrating still another example of the light-receiving unit of the image capturing device illustrated in FIG. 8.

It is not necessary for the arrangement of the pixels $P_1$ to $P_N$ in the X-direction to be an arrangement in which the first pixel 12B and the second pixel 13B are alternately arranged in parallel, and the arrangement may be another arrangement. FIG. 10 is a schematic configuration diagram illustrating still another example of the arrangement of the pixels $P_1$ to $P_N$ according to this modification example. In the example illustrated in FIG. 10, straight lines which constitute the right angle of each of the first pixels 12B are arranged to face each other in the X-direction. Similarly, straight lines which constitute the right angle of each of the second pixels 13B are arranged to face each other in the X-direction.

Figure 11:
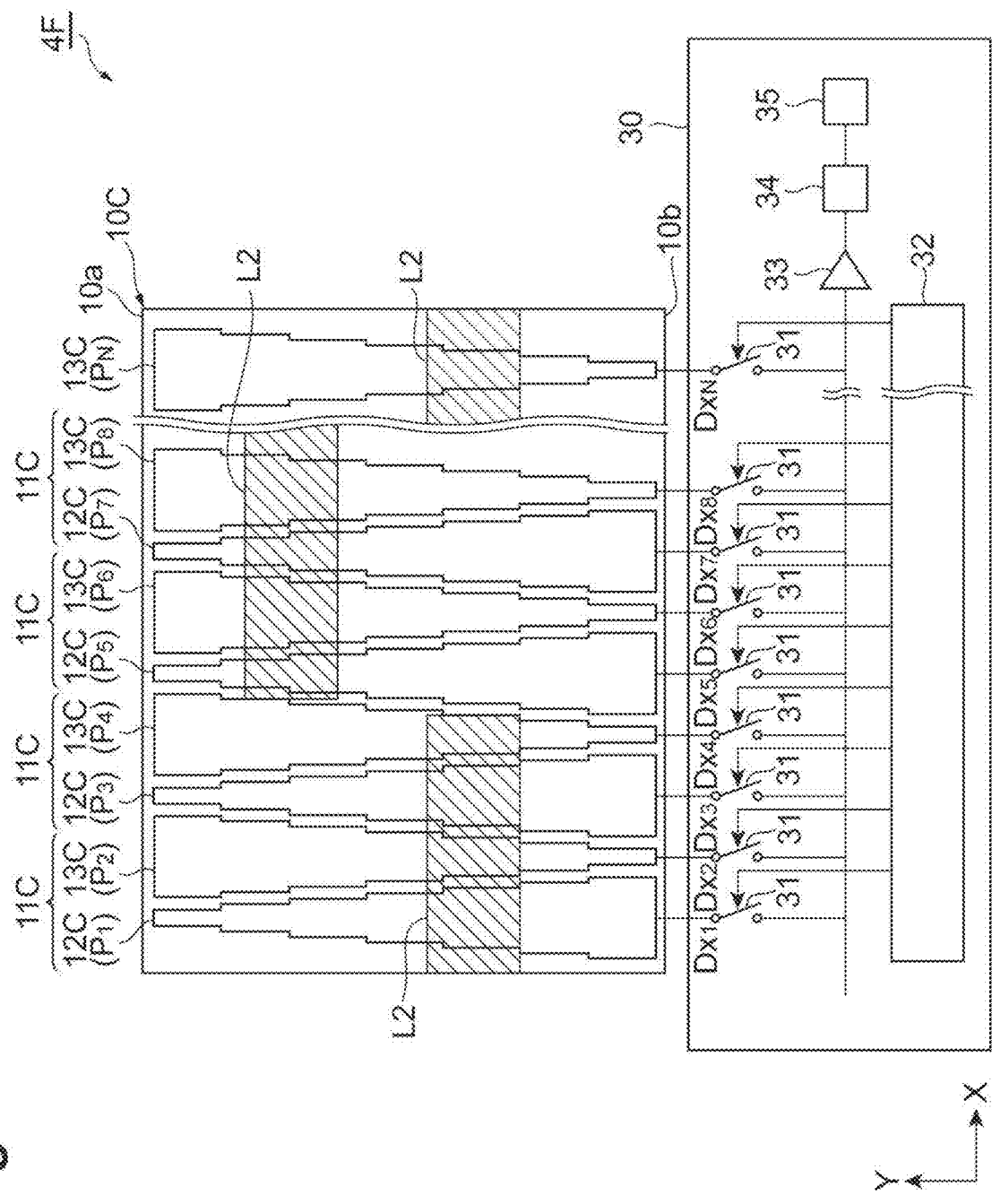
FIG. 11 is a schematic configuration diagram illustrating still another example of the light-receiving unit of the image capturing device illustrated in FIG. 8.

FIG. 11 is a schematic configuration diagram illustrating still another example of the shape of the pixels $P_1$ to $P_N$ according to this modification example. In the example illustrated in FIG. 11, a width of a first pixel 12C in the X-direction decreases step by step (in a step shape) as it is closer to one end 10a of a light-receiving unit 10C in the Y-direction, and increases step by step (in a step shape) as it is closer to the other end 10b of the light-receiving unit 10C in the Y-direction. On the other hand, a width of a second pixel 13C in the X-direction increases step by step (in a step shape) as it is closer to the one end 10a, and decreases step by step (in a step shape) as it is closer to the other end 10b. In the example illustrated in FIG. 11, an area of the light-receiving unit 10C is, for example, 2000 µm², and an arrangement pitch of the pixels $P_1$ to $P_N$ in the X-direction is, for example, 7.5 µm.

Figure 12:
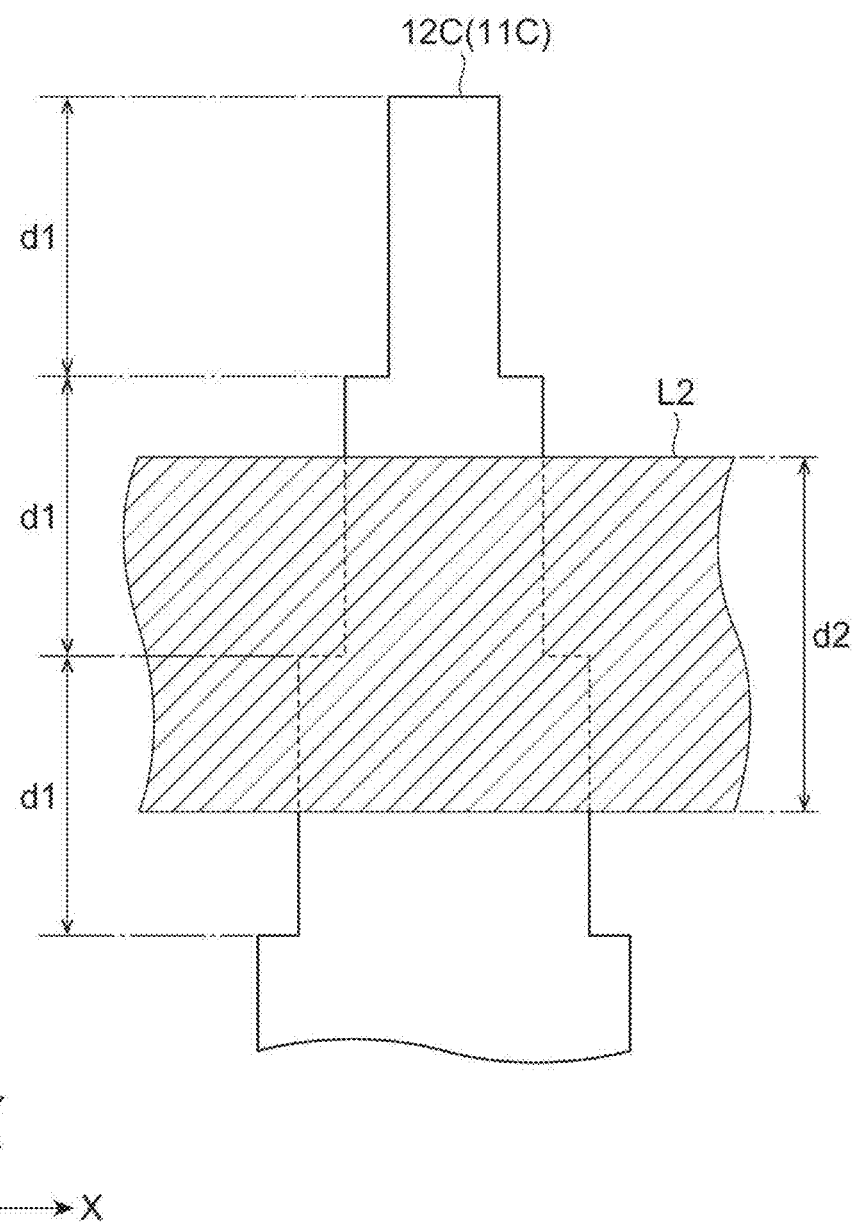
FIG. 12 is an enlarged view in which a part of the light-receiving unit illustrated in FIG. 11 is enlarged.

FIG. 12 is an enlarged view in which the first pixel 12C among the pixels $P_1$ to $P_N$ illustrated in FIG. 11 is enlarged. As illustrated in FIG. 12, in the first pixel 12C, a step difference is formed on both sides of the first pixels 12C in the X-direction so that the width of the first pixel 12C in the X-direction broadens whenever it is spaced away from the one end 10a toward the other end 10b by a distance d1 (for example, 16.25 µm). The step difference is provided with the same interval (that is, the distance d1) at 123 sites along the Y-direction. For example, a width of each step difference in the X-direction is 0.05 µm. A total length of the first pixel 12C in the Y-direction is, for example, 1998.75 µm, and a width of the apex of the first pixel 12C on the one end 10a side in the X-direction is, for example, 0.8 µm, and a width of a lower side of the first pixel 12C on the other end 10b side in the X-direction is, for example, 13 µm (refer to FIG. 11). The second pixel 13C has the same shape as in the first pixel 12C, and is disposed in a direction opposite to the first pixel 12C in the Y-direction. A width d2 of the reflected light L2 incident to the pixels $P_1$ to $P_N$ having the shape in the Y-direction is, for example, 20 µm, and is set to be larger than the distance d1 between the step differences of each of the pixels $P_1$ to $P_N$ in the Y-direction.

Figure 13:
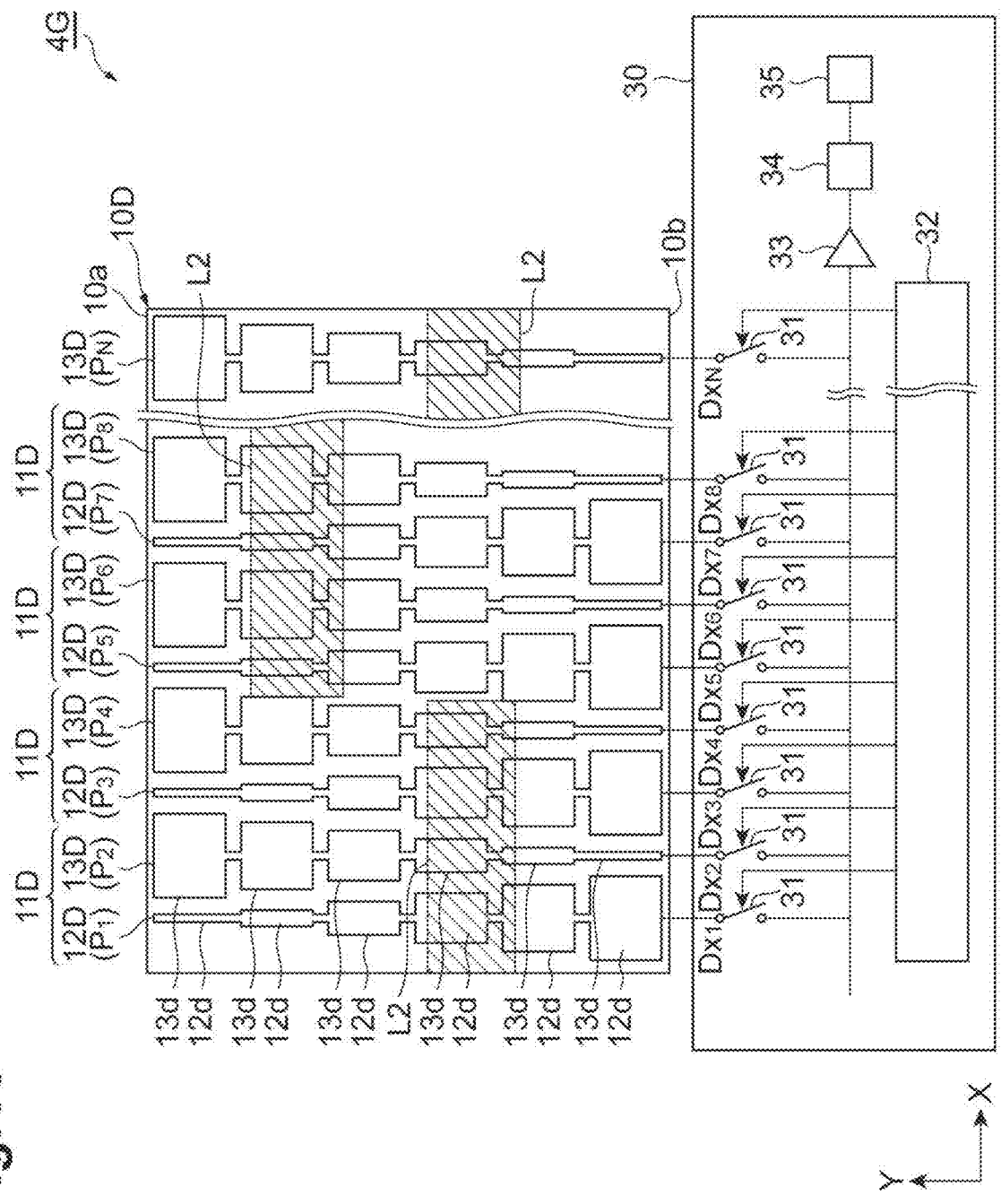
FIG. 13 is a schematic configuration diagram illustrating still another example of the light-receiving unit of the image capturing device illustrated in FIG. 8.

FIG. 13 is a schematic configuration diagram illustrating still another example of the shape of the pixels $P_1$ to $P_N$ according to this modification example. In the example illustrated in FIG. 13, a first pixel 12D of each pixel pair 11D includes a plurality of (for example, six) light-receiving region 12d having a square shape. A width of the light-receiving regions 12d in the X-direction is smaller as it is closer to one end 10a of a light-receiving unit 10D, and is larger as it is closer to the other end 10b of the light-receiving unit 10D. A second pixel 13D of the pixel pair 11D includes a plurality of (for example, six) light-receiving regions 13d having a square shape. A width of the light-receiving regions 13d in the X-direction is larger as it is closer to the one end 10a of the light-receiving unit 10D, and is smaller as it is closer to the other end 10b of the light-receiving unit 10D. Even in a case of employing the pixels $P_1$ to $P_N$ illustrated in FIG. 9 to FIG. 13, it is possible to obtain the same effect as in the embodiment.

Fourth Modification Example

Figure 14:
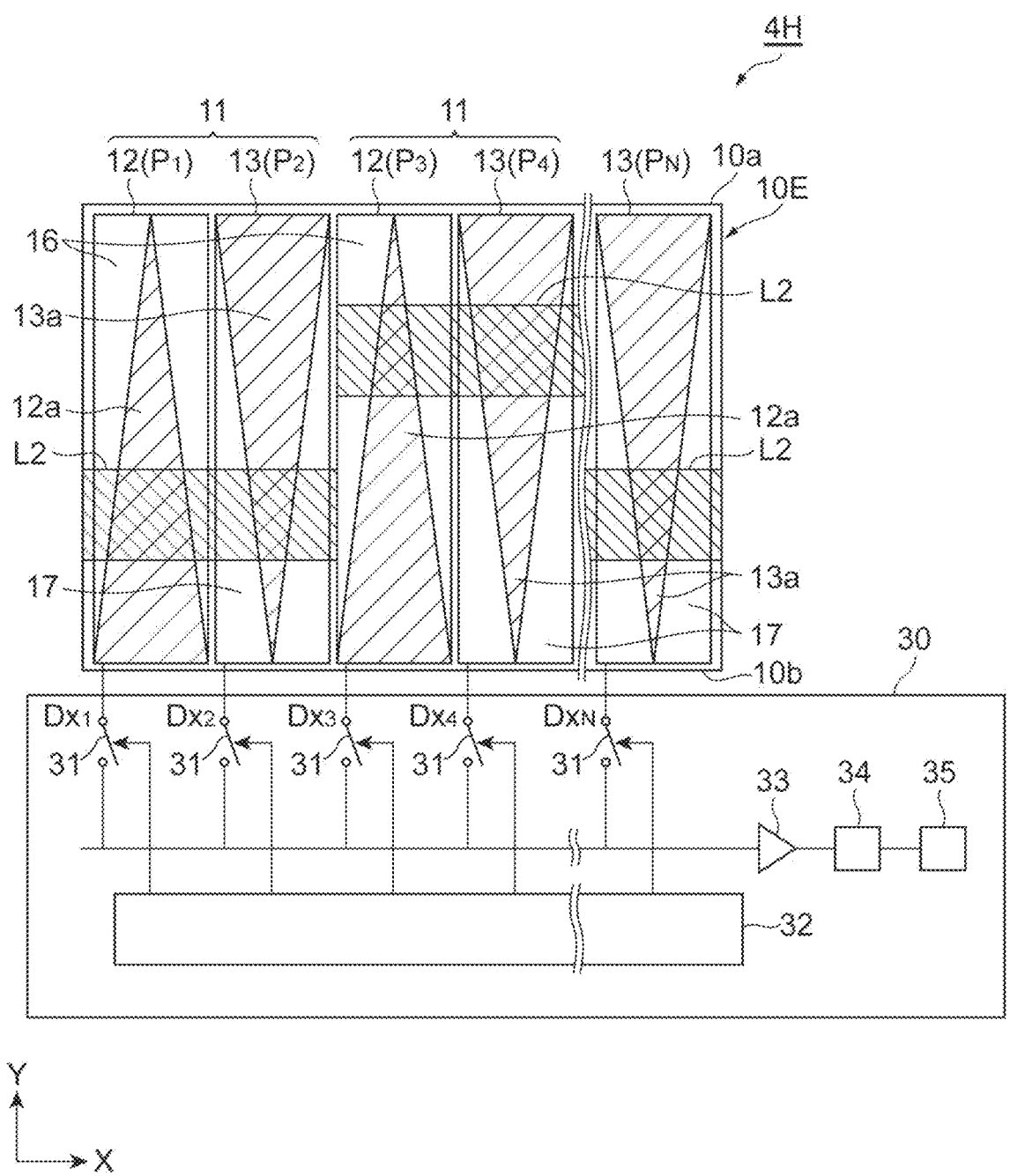
FIG. 14 is a schematic configuration diagram illustrating an image capturing device according to a fourth modification example.

FIG. 14 is a schematic configuration diagram illustrating an image capturing device 4H according to a fourth modification example. In this modification example, a light-receiving unit 10E includes a plurality of first light-shielding parts 16 and a plurality of light-shielding parts 17 instead of a plurality of first transmission filter 14 and a plurality of second transmission filters 15. Each of the first light-shielding parts 16 is disposed on the first pixel 12, and shields the incident reflected light L2. The first light-shielding part 16 covers another portion excluding one portion 12a of the first pixel 12. A width of the one portion 12a in the X-direction gradually decreases (or decreases step by step) as it is closer to one end 10a of the light-receiving unit 10E in the Y-direction, and gradually increases (or increases step by step) as it is closer to the other end 10b of the light-receiving unit 10E. In an example, the one portion 12a has an isosceles triangular shape that tapers toward the one end 10a side in the Y-direction. In this case, the first light-shielding part 16 has a shape that is hollowed out in the isosceles triangular shape.

On the other hand, each of the second light-shielding parts 17 is disposed on the second pixel 13, and shields the incident reflected light L2. The second light-shielding part 17 covers another portion excluding one portion 13a of each of a plurality of the second pixels 13. A width of the one portion 13a in the X-direction gradually increases (or increases step by step) as it is closer to the one end 10a, and gradually decreases (or decreases step by step) as it is closer to the other end 10b. In an example, the one portion 13a has an isosceles triangular shape that tapers toward the other end 10b side in the Y-direction. In this case, the second light-shielding part 17 has a shape that is hollowed out in the isosceles triangular shape.

When the light-receiving unit 10E includes the first light-shielding parts 16 and the second light-shielding parts 17, in a plurality of the first pixels 12, as an incident position of the reflected light L2 in the Y-direction is closer to the one end 10a in the Y-direction, an incident light amount of the reflected light L2 incident to the first pixels 12 decreases, and according to this, intensities of charge signals $Dx_1$, $Dx_3$, ..., and $Dx_{N-1}$ generated in the first pixels 12 also decrease. In contrast, in the second pixels 13, as the incident position of the reflected light L2 in the Y-direction is closer to the one end 10a in the Y-direction, an incident light amount of the reflected light L2 incident to the second pixels 13 increases, and according to this, intensities of charge signals $Dx_2$, $Dx_4$, ..., and $Dx_N$ generated in the second pixels 13 also increase. Even in this aspect, it is possible to obtain the same effect as in the embodiment.

Fifth Modification Example

Figure 15:
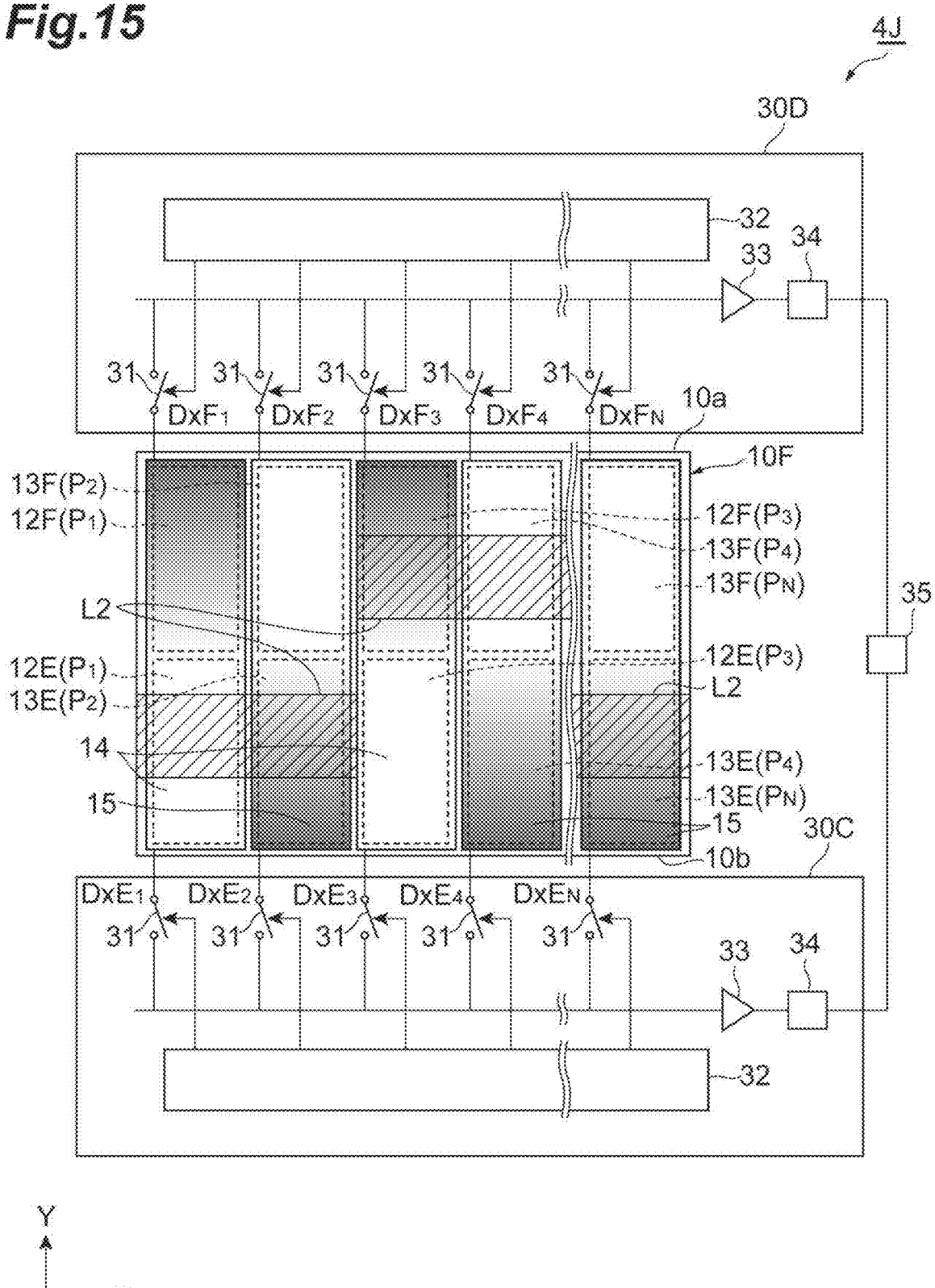
FIG. 15 is a schematic configuration diagram illustrating an image capturing device according to a fifth modification example.

FIG. 15 is a schematic configuration diagram illustrating an image capturing device 4J according to a fifth modification example. A difference between this modification example and the embodiment is in that each of pixels $P_1$ to $P_N$ of this modification example are divided into two parts in the Y-direction, and two signal processing units are provided. As illustrated in FIG. 15, the image capturing device 4J includes a light-receiving unit 10F, and signal processing units 30C and 30D. Each of the pixels $P_1$ to $P_N$ of the light-receiving unit 10F is divided into two parts at a boundary near the center in the Y-direction. Each first pixel 12 includes a region 12E located on the other end 10b side of the light-receiving unit 10F in the Y-direction, and a region 12F located on the one end 10a side of the light-receiving unit 10F in the Y-direction in the two divided regions. Each second pixel 13 includes a region 13E located on the other end 10b side of the light-receiving unit 10F, and a region 13F located on the one end 10a side of the light-receiving unit 10F in the two divided regions.

The signal processing units 30C and 30D are provided on both sides of the pixels $P_1$ to $P_N$ in the Y-direction, respectively. Each of the signal processing units 30C and 30D includes the plurality of switch elements 31, the shift register 32, the amplifier 33, and the A/D converter 34. Input terminals of the switch elements 31 of the signal processing unit 30C are electrically connected to a plurality of the regions 12E and 13E, and the input terminals of the switch elements 31 of the signal processing unit 30D are electrically connected to the regions 12F and 13F. The calculation unit 35 is electrically connected to the A/D converter 34 of the signal processing unit 30C, and the A/D converter 34 of the signal processing unit 30D. As in the embodiment, the calculation unit 35 calculates position information $Lx_r$ and position information $Ly_r$ with respect to an incident position of the reflected light L2 incident to the light-receiving unit 10F on the basis of charge signal $DxE_1$ or $DxE_N$ generated in the regions 12E and 13E and charge signal $DxF_1$ or $DxF_N$ generated in the regions 12F and 13F.

In the image capturing device 4J of this modification example, each of the pixels $P_1$ to $P_N$ is divided into two parts, and as a result, the charge signal $DxE_1$ or $DxE_N$ generated in the regions 12E and 13E are read out by the signal processing unit 30C, and the charge signal $DxF_1$ or $DxF_N$ generated in the regions 12F and 13F are read out by the signal processing unit 30D. According to this, in each of the pixels $P_1$ to $P_N$, it is possible to shorten a distance from a portion to which the reflected light L2 is incident to each of the switch elements 31. As a result, utilization efficiency of the reflected light L2 incident to the pixels $P_1$ to $P_N$ is raised, and accuracy of the position information $Lx_r$ and the position information $Ly_r$ can be improved.

Sixth Modification Example

Figure 16:
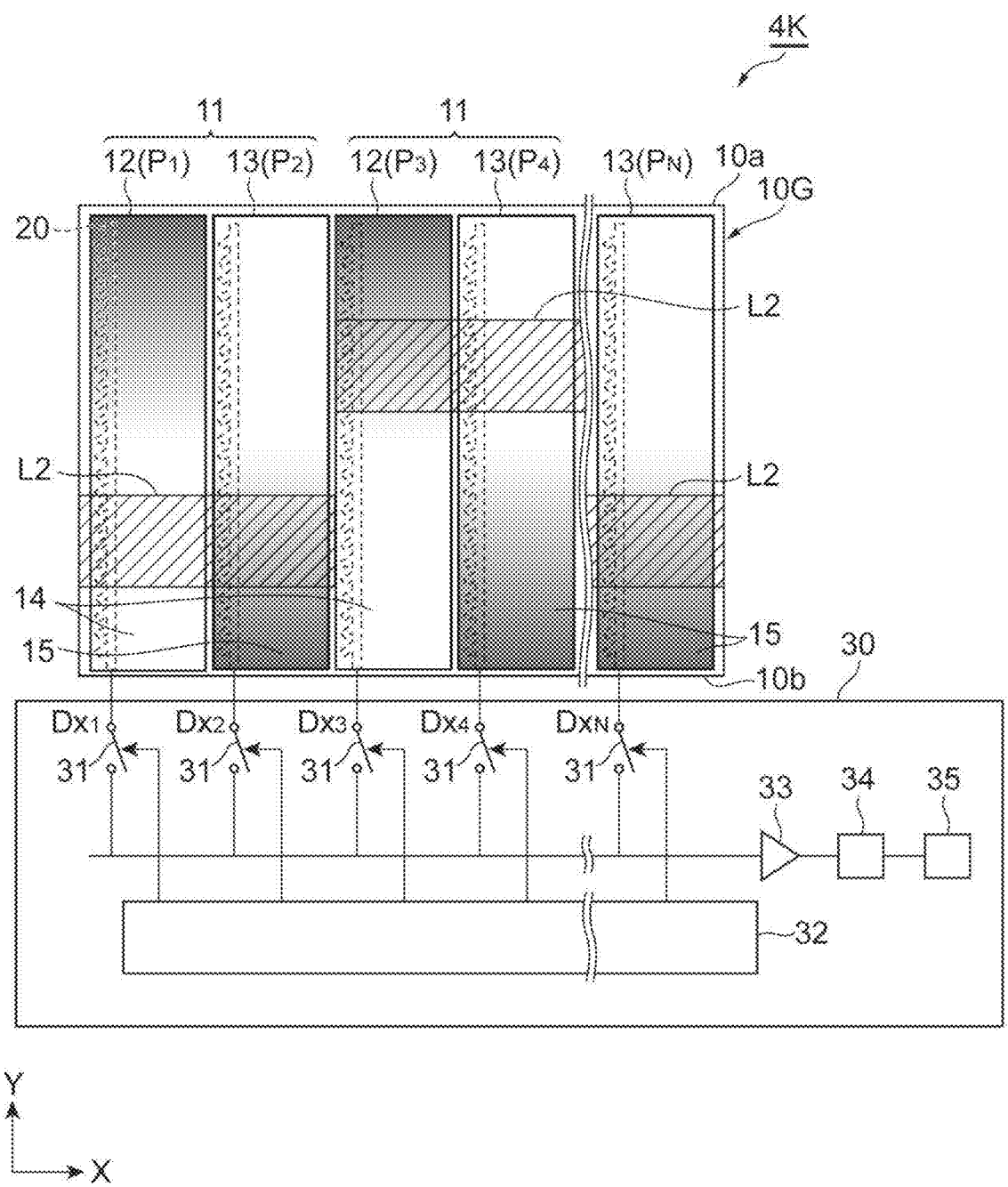
FIG. 16 is a schematic configuration diagram illustrating an image capturing device according to a sixth modification example.

FIG. 16 is a schematic configuration diagram illustrating an image capturing device 4K according to a sixth modification example. A difference between this modification example and the embodiment is in that a light-receiving unit 10G of this modification example includes a plurality of metal wires 20. For example, the metal wires 20 are aluminum (Al) wires. The metal wires 20 are respectively provided in correspondence with pixels $P_1$ to $P_N$. The metal wires 20 extend on the pixels $P_1$ to $P_N$ along the Y-direction, and are continuously or intermittently connected to the pixels $P_1$ to $P_N$. The metal wires 20 are electrically connected to the input terminals of the switch elements 31, respectively. In the pixels $P_1$ to $P_N$, as the incident position of reflected light L2 in the Y-direction is spaced away from each of the switch elements 31, time is further taken in reading-out of charge signals $Dx_1$ to $Dx_N$ generated in the pixels $P_1$ to $P_N$. The reason for this is considered because a movement speed of the charge signals $Dx_1$ to $Dx_N$ in a diffusion layer that constitutes the pixels $P_1$ to $P_N$ is slow, and thus time is taken for transferring the charge signals $Dx_1$ to $Dx_N$.

Here, the metal wires 20 extending along the Y-direction are respectively provided on the pixels $P_1$ to $P_N$, and the metal wires 20 are respectively connected to the switch elements 31 so that the charge signals $Dx_1$ to $Dx_N$ pass through the metal wires 20. According to this, it is possible to improve the movement speed of the charge signals $Dx_1$ to $Dx_N$, and it is possible to improve a reading-out speed of the charge signals $Dx_1$ to $Dx_N$.

The shape measurement sensor of the present disclosure is not limited to the embodiment and the modification examples, and various modifications can be additionally made. For example, the embodiment and the modification examples may be combined in correspondence with an object and an effect which are required.

REFERENCE SIGNS LIST 1, 1A: shape measurement sensor, 2: object, 2a: surface, 3: light source, 4, 4A, 4B to 4H, 4J, 4K: image capturing device, 10, 10A to 10G: light-receiving unit, 10a: one end, 10b: other end, 11, 11A to 11D: pixel pair, 12, 12A to 12D: first pixel, 12a, 13a: one portion, 13, 13A to 13D: second pixel, 14: first transmission filter, 15: second transmission filter, 16: first light-shielding part, 17: second light-shielding part, 20: metal wire, 30, 30A to 30D: signal processing unit, Da: irradiation direction, Db: inclination direction, $Dx_1$ to $Dx_N$: charge signal, L1: laser light, L2: reflected light, Lx, Ly: position information, ML: measurement line.

The invention claimed is:

1. A shape measurement sensor that detects light that is emitted to irradiate a measurement line on a surface of an object and is reflected on the surface of the object to measure a surface shape of the object, the shape measurement sensor comprising:
a light-receiving unit to which the light reflected on the measurement line is incident from a direction that is inclined with respect to an irradiation direction of the light; and
a calculation unit that detects an incident position of the light in the light-receiving unit, and calculates position information of each position on the measurement line on the basis of the incident position,
wherein the light-receiving unit includes a plurality of pixel pairs, each of the pixel pairs including a first pixel that generates a first electric signal corresponding to an incident light amount of the light and a second pixel that is disposed side by side with the first pixel along a first direction intersecting the irradiation direction and generates a second electric signal corresponding to an incident light amount of the light, and the pixels pairs being arranged along the first direction,
in the first pixel, as the incident position is closer to one end of the light-receiving unit in a second direction intersecting the first direction, the intensity of the first electric signals decreases,
in the second pixel, as the incident position s closer to the one end in the second direction, the intensity of the second electric signal increases, and
the calculation unit acquires the first electric signal and the second electric signal for each of the pixel pairs, and calculates the incident position in the second direction for each of the pixel pairs on the basis of the intensity of the acquired first electric signal and the intensity of the acquired second electric signal.

2. The shape measurement sensor according to claim 1, wherein the calculation unit calculates the incident position in the second direction for each of the pixel pairs by using a ratio between the intensity of the first electric signal and the intensity of the second electric signal.

3. The shape measurement sensor according to claim 1, wherein the calculation unit calculates the incident position in the second direction for each of the pixel pairs by using a ratio between the intensity of the first electric signal or the intensity of the second electric signal, and a total value of the intensity of the first electric signal and the intensity of the second electric signal.

4. The shape measurement sensor according to claim 1, wherein the light-receiving unit further includes a first transmission filter which covers the first pixel and through which the light is transmitted, and a second transmission filter which covers the second pixel and through which the light is transmitted,
a transmittance of the light in the first transmission filter decreases as it is closer to the one end in the second direction, and
a transmittance of the light in the second transmission filter increases as it is closer to the one end in the second direction.

5. The shape measurement sensor according to claim 1, wherein the light-receiving unit further includes a first light-shielding part that covers another portion of the first pixel excluding one portion of the first pixel, and shields the light, and a second light-shielding part that covers another portion of the second pixel excluding one portion of the second pixel and shields the light, a width of the one portion of the first pixel in the first direction decreases as it is closer to the one end in the second direction, and a width of the one portion of the second pixel in the first direction increases as it is closer to the one end in the second direction.

6. The shape measurement sensor according to claim 1, wherein a width of the first pixel in the first direction decreases as it is closer to the one end in the second direction, and a width of the second pixel in the first direction increases as it is closer to the one end in the second direction.

* * * * *